US009818871B1

(12) United States Patent
Peer et al.

(10) Patent No.: US 9,818,871 B1
(45) Date of Patent: Nov. 14, 2017

(54) DEFENSE LAYER AGAINST SEMICONDUCTOR DEVICE THINNING

(71) Applicant: Cisco Technology, Inc., San Jose, CA (US)

(72) Inventors: Elad Peer, Yokneam Ilit (IL); Uri Bear, Pardes-Hana (IL)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 15/298,258

(22) Filed: Oct. 20, 2016

(51) Int. Cl.
*H01L 21/00* (2006.01)
*B81B 3/00* (2006.01)
*H01L 29/78* (2006.01)
*H01L 29/737* (2006.01)
*H01L 21/02* (2006.01)

(52) U.S. Cl.
CPC .... *H01L 29/7842* (2013.01); *H01L 21/02304* (2013.01); *H01L 29/7378* (2013.01)

(58) Field of Classification Search
CPC ............... H01L 29/7842; H01L 21/02304
USPC ............... 257/415–420; 438/50–52
See application file for complete search history.

(56) References Cited

U.S. PATENT DOCUMENTS

| | | | |
|---|---|---|---|
| 5,468,990 A | 11/1995 | Daum | |
| 7,005,733 B2 | 2/2006 | Kommerling et al. | |
| 7,296,299 B2 | 11/2007 | Schwenck et al. | |
| 7,966,666 B2 | 6/2011 | Walker et al. | |
| 8,330,191 B2 | 12/2012 | Hoofman et al. | |
| 8,330,235 B2 | 12/2012 | Ramani et al. | |
| 8,362,503 B2 * | 1/2013 | Saxler | H01L 21/02381 257/96 |
| 8,828,813 B2 * | 9/2014 | Huang | H01L 29/0847 438/183 |
| 8,853,666 B2 * | 10/2014 | Inoue | H01L 29/155 257/12 |
| 8,952,419 B2 * | 2/2015 | Tak | H01L 21/02381 257/190 |
| 9,076,699 B2 | 7/2015 | Zhang et al. | |

(Continued)

FOREIGN PATENT DOCUMENTS

JP 2010010299 1/2010

OTHER PUBLICATIONS

Chong; Desmond Y.R et al.; Mechanical Characterization in Failure Strength of Silicon Dice (2004) Can be seen at: http://www.utacgroup.com/library/5_ITherm2004_ID_412.pdf.

(Continued)

*Primary Examiner* — Calvin Lee
(74) *Attorney, Agent, or Firm* — Samuel M. Katz

(57) ABSTRACT

In one embodiment, a semiconductor device comprises one or more defense layers, the one or more defense layers each characterized by at least two lattice constants that are mismatched, wherein a mismatch in the lattice constants causes a destabilizing force that comprises at least one of a tensile force or a compressive force; and a plurality of other layers, wherein at least a sufficient part of the destabilizing force is restrained for the one or more defense layers to remain intact unless reduction in thickness of at least a section of one or more of the plurality of other layers, causes at least some of the destabilizing force that was restrained to no longer be restrained, and consequently at least part of at least one of the one or more defense layers to break.

20 Claims, 7 Drawing Sheets

(56) References Cited

U.S. PATENT DOCUMENTS

| | | | |
|---|---|---|---|
| 9,312,428 B2* | 4/2016 | Shatalov | H01L 33/007 33/2 |
| 9,349,590 B2* | 5/2016 | Hikosaka | H01L 21/02389 438/478 |
| 2015/0034967 A1* | 2/2015 | Ishiguro | H01L 29/7783 257/76 |
| 2017/0154986 A1* | 6/2017 | Su | H01L 29/7783 |

OTHER PUBLICATIONS

Laun, Christoph et al.; Fracture and Fragmentation of Silicon Dies; PAMM vol. 10, Issue 1, Article first published online: Nov. 16, 2010 Can be seen at: http://onlinelibrary.wiley.com/doi/10.1002/pamm.201010054/pdf.

Nanowerk News; Researchers Develop a Semiconductor Chip Made Almost Entirely of Wood (May 26, 2015).

Özdöl, Burak et al.; TEM for Strain-Engineered Devices Dark-Field Inline Holography for Nanoscale Strain Mapping, Published on Imaging & Microscopy (http://www.imaging-git.com ) Jun. 4, 2012.

Paschotta, R.; Bragg Mirrors; in the Encyclopedia of Laser Physics and Technology, accessed May 8, 2016.

Piwnicki, Paul; Silicon Nanowires Under Extreme Tensile Strain May Lead to More Efficient Transistors (Oct. 8, 2012).

Ritchie, Robert O.,Failure of Silicon: Failure of Silicon: Crack Formation and Propagation; 13th Workshop on Crystalline Solar Cell Materials and Processes Aug. 2003, Vail, Colorado Can be seen at: http://www2.lbl.gov/ritchie/Programs/FILM/Ritchie_Si_solar_Vail03.pdf.

Rohatgi, Pankaj; Improved Techniques for Side-Channel Analysis, Cryptographic Engineering , Chapter 14, pp. 381-406, ISBN: 978-0-387-71816-3 (Print) 978-0-387-71817-0 (Online) Springer, 2009.

Spieler, Helmuth; Introduction to Radiation Detectors and Electronics, Lecture Notes—Physics 198, Spring Semester 1998—UC Berkeley Chapter VIII.2.c. A Semiconductor Device Primer, Fabrication of Semiconductor Devices.

Thompson, Scott E. et al.; A 90-nm Logic Technology Featuring Strained-Silicon. IEEE Transactions on Electron Devices, vol. 51, No. 11, pp. 1790-1797, Nov. 2004, doi: 10.1109/TED.2004.836648.

Tsague, Hippolyte Djonon et al,; Simulation and Parameter Optimization of Polysilicon Gate Biaxial Strained Silicon MOSFETS, Digital Information Processing and Communications (ICDIPC), 2015 Fifth International Conference on, Sierre, 2015, pp. 38-43.

van der Linden, Peter; Just JAVATM 2 (6th Edition) Jun. 21, 2004, chapter 7, p. 156.

Wikipedia; Dielectric Mirror Can be seen at: https://en.wikipedia.org/wiki/Dielectric_mirror.

* cited by examiner

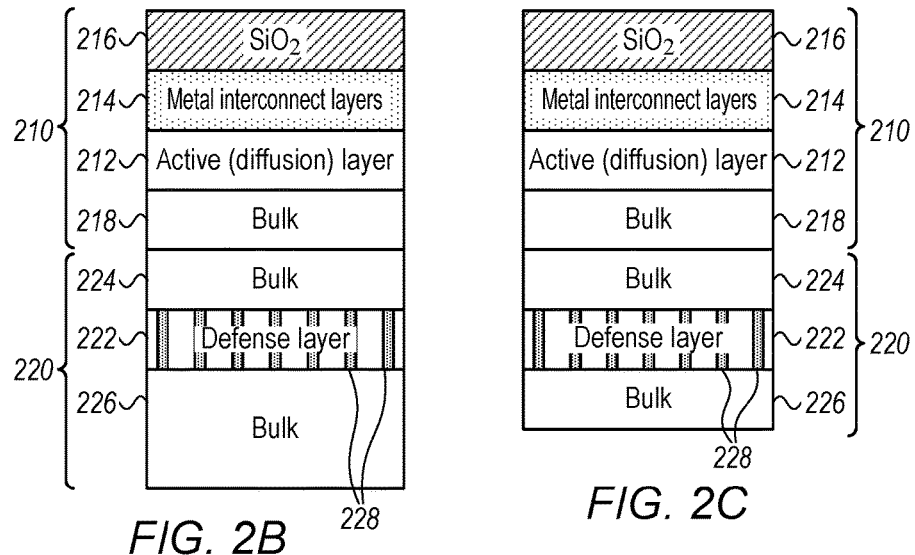
FIG. 2B  FIG. 2C
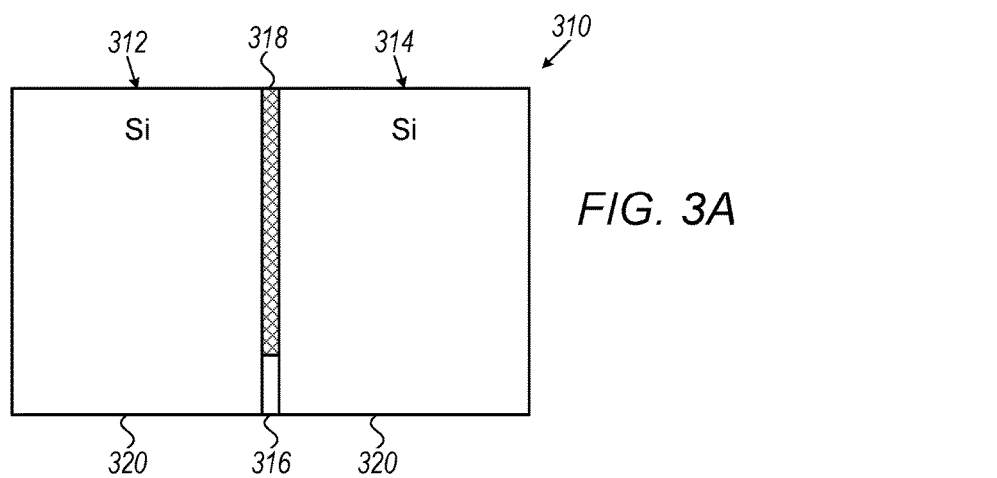
FIG. 3A
FIG. 3B

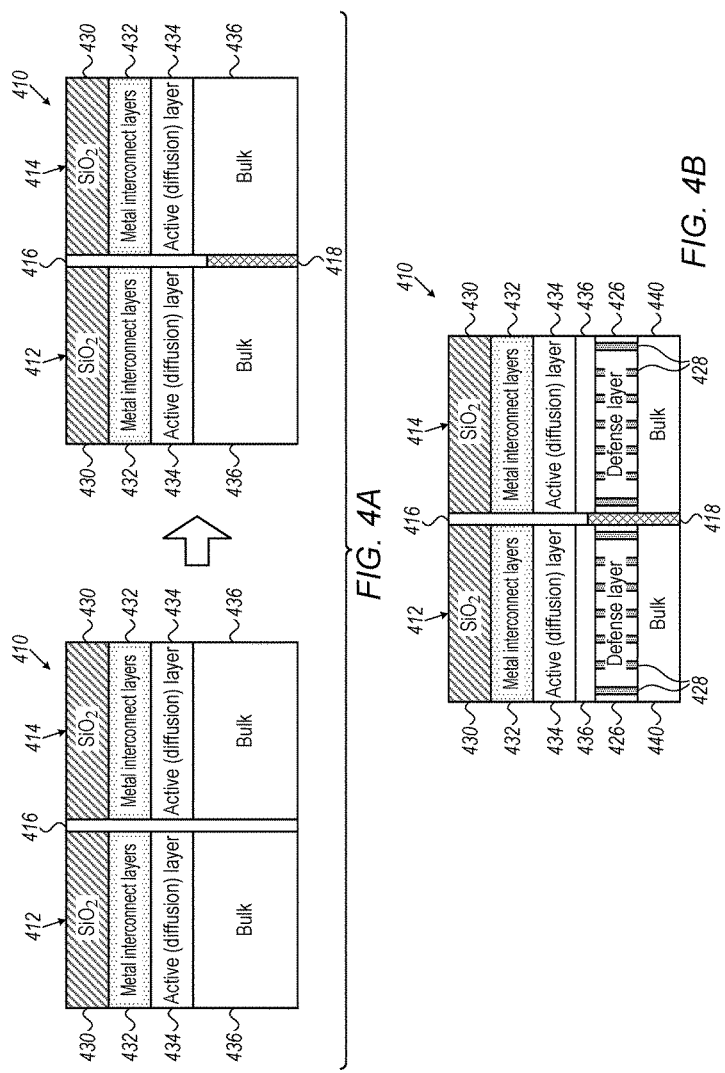

DEFENSE LAYER AGAINST SEMICONDUCTOR DEVICE THINNING

TECHNICAL FIELD

The present disclosure generally relates to protection of semiconductor devices.

BACKGROUND

Physical techniques used for attacking and reverse engineering modern semiconductor devices may include device thinning as part of sample preparation. Such an attack may be termed for convenience "a thinning attack". For instance, it may be necessary to thin the device in order to enable optical attack techniques. Referring as an example to a device with that includes embedded logic, memory and so forth, an optical attack may be capable of changing the state of a logic cell, reading logic states, or increasing the current consumption of the logic cell dependent on the state thereof, so that the increase in current consumption may be measured in order to determine the logic cell state. Thinning may also be referred to as de-processing. An example of de-processing may be layer by layer de-processing for reverse engineering or other attacks. De-processing may be a process used to understand the structure of the device, by removing layers and imaging them, then re-building the device structural and electrical connection and logical schemes. Additionally or alternatively, de-processing may be used as a preparation stage for device editing and other attacks.

BRIEF DESCRIPTION OF THE DRAWINGS

The present disclosure will be understood and appreciated more fully from the following detailed description, taken in conjunction with the drawings in which:

FIG. 2B illustrates an example of second support, in accordance with some embodiments of the presently disclosed subject matter;

FIG. 2C illustrates an example of removal of a part of the first support, in accordance with some embodiments of the presently disclosed subject matter;

FIG. 3A illustrates another example of first support, in accordance with some embodiments of the presently disclosed subject matter;

FIG. 3B illustrates another example of a defense layer, in accordance with some embodiments of the presently disclosed subject matter;

FIG. 4A illustrates another example of first support, in accordance with some embodiments of the presently disclosed subject matter;

FIG. 4B illustrates another example of a defense layer, in accordance with some embodiments of the presently disclosed subject matter;

DESCRIPTION OF EXAMPLE EMBODIMENTS

Overview

Figure 1:
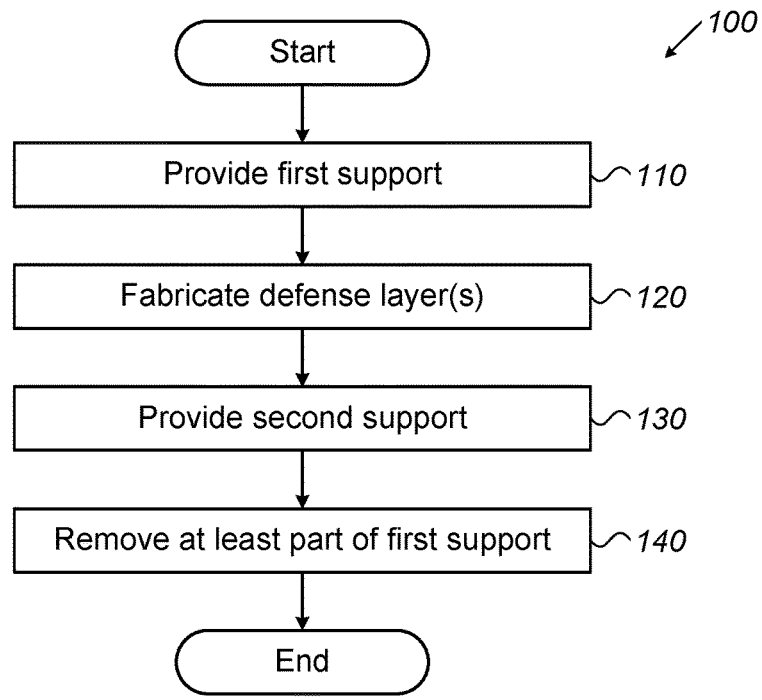
FIG. 1 is a flowchart of a method of fabricating a semiconductor device, in accordance with some embodiments of the presently disclosed subject matter.

There is provided, in accordance with some embodiments of the presently disclosed subject matter, a semiconductor device, comprising: one or more defense layers, the one or more defense layers each characterized by at least two lattice constants that are mismatched, wherein a mismatch in the lattice constants causes a destabilizing force that comprises at least one of: a tensile force or a compressive force; and a plurality of other layers, wherein at least a sufficient part of the destabilizing force is restrained for the one or more defense layers to remain intact unless reduction in thickness of at least a section of one or more of the plurality of other layers, causes at least some of the destabilizing force that was restrained to no longer be restrained, and consequently at least part of at least one of the one or more defense layers to break.

Example Embodiments

In some embodiments of the presently disclosed subject matter, a semiconductor device (also referred to herein as "device") may include a plurality of layers.

The number and type(s) of layers in the semiconductor device may include at least one defense layer and/or defense pair of layers but may otherwise vary depending on example. Moreover, the materials used in the layers of the semiconductor device may vary depending on the example. However, for the sake of further illustration to the reader, some examples are now provided.

For example, in some embodiments, there may be one or more active layer(s), also referred to as diffusion layer(s), including one or more electrical element(s) (also referred to as "elements", "electronic element(s)", or "active circuitry") operative to perform the function(s) of the semiconductor device. Electrical elements may be elements that may be part of an electric circuit on which one may define at least two points and determine a relationship between the voltages applied to the points and the current flowing between the points. The electrical element(s) that are included in the active layer(s) may vary depending on the instance, but for the sake of further illustration to the reader some instances are now given. For instance, electrical element(s) may include passive, active and/or electro-mechanic elements such as transistors, capacitors, resistors, inductors, diodes, and/or transformers, etc. Typically although not necessarily, the electrical elements in active layer(s) may be fabricated by any suitable technique(s) such as doping (e.g. diffusion or ion implantation), etching, deposition and/or patterning of various materials. Any layer of the semiconductor device that is not an active layer may be referred to herein as a non-active layer.

For simplicity's sake a device may be considered to be a semiconductor device if active layer(s) of the device include(s) at least one semiconductor material, regardless of the type(s) of material in other layers of the device, or of other material(s), if any, in the active layer(s). In the description herein reference to the primary material included in an active layer(s) means the material which is used in greater quantity in the active layer(s) than any other material that is used in the active layer(s), and if there is no such material then the primary material may be one of the materials which is used in equal quantity in the active layer(s), the equal quantity being greater than the quantity/ies of the other material(s) used in the active layer(s). Typically although not necessarily, the primary material may be a semiconductor material.

In embodiments where the active layer(s) of a semiconductor device include(s) a plurality of electrical elements, the semiconductor device may further include, for example, one or more interconnect layer(s) for connecting the elements. Continuing with the example, a particular interconnect layer may include, for instance, conducting (e.g. metal) material, insulating (e.g. dielectric) material, and any vertical conductors (e.g. via(s)) to other layers in the semiconductor device. For instance, an interconnect layer may be formed by depositing films of metal (e.g. aluminum, copper) which are then patterned and etched to form wires. Dielectric material may then be deposited over the wires, and if there is more than one interconnect layer, the layers may be interconnected by vias. The interconnect layer(s) are conventionally not referred to as active layer(s) since a wire is electrically a single point, with all locations on the wire (ideally) sharing the same voltage level.

A semiconductor device may further include, for example, one or more bulk layer(s). The main role of a bulk layer is to provide mechanical support, and therefore any layer whose main role is to provide mechanical support may be termed herein a "bulk layer". A bulk layer may include any appropriate material which may provide such support. A bulk layer may also provide thermal dispersion. Typically, a bulk layer may not have an electrical role, but in some cases a bulk layer may have an electrical role (e.g. due to inclusion of a "Through Silicon Via" also referred to as "TSV") that is minor in comparison to the electrical role of an active layer. Typically although not necessarily, the bulk layer(s) may be below the active layer(s).

The bulk layer(s) may in some embodiments include at least one of the material(s) used in the active layer(s), such as the primary material used in the active layer(s). In some of such embodiments, one or more wafers, or in other words thin slice(s) of semiconductor material, such as single-crystal silicon, may be used, at least for the bulk and/or active layer(s). However, there has been some public research regarding use of other material(s), such as material made from cellulose nanofibril, for at least the bulk layer(s) and/or the active layer(s) except where required for functioning of the electrical element(s).

A semiconductor device may include, for example, one or more protection layer(s) which may provide protection against scratching, moisture, and/or contamination, etc. Typically although not necessarily, the protection layer(s) may be above the active layer(s), e.g. directly above the interconnect layer(s). For example, the protection layer(s), which in some cases may be passivation layer(s), may be composed of material(s) such as a silicon, silicon nitride, silicon dioxide, aluminum oxide, etc., which may provide such protection against scratching, moisture, contamination, etc. In other examples, the semiconductor device may not include such protection layer(s).

In accordance with embodiments of the presently disclosed subject matter, a semiconductor device may include one or more defense layer(s) and/or one or more defense pairs of layers. The defense layer(s) and/or pair(s) may be fragile, or in other words breakable, meaning that a defense layer or pair of layers may not be meant to remain intact under abnormal circumstances such as a thinning attack.

The term "layer" as used herein should be interpreted broadly, as any layer in a device may not necessarily extend over the entire layer directly below, and/or may not necessarily be entirely covered by the layer directly above. It should therefore be understood that in some cases a defense layer may extend only partly over a layer directly below and/or may be covered only partly by the layer directly above. Typically although not necessarily, however, layers in a device may not overlap in depth, meaning that a certain depth level in the device typically although not necessarily may correspond to a single layer.

A "break", "to break", or variants thereof as used herein may or may not include a complete separation into two or more components. For example, break may be a synonym for crack when break excludes a complete separation. As another example, when break includes a complete separation, if at least part of a layer breaks, then the complete separation and number of resulting components may include any appropriate scenario such as: the at least part may separate from the rest of the layer(s); part of the at least part may separate from the rest of the at least part; the at least part may separate into a plurality of parts, etc. The term "intact" as used herein means unbroken.

The placement of the defense layers(s) or pair(s) of layers within the semiconductor device may vary depending on the example. However for the sake of further illustration to the reader some examples are now provided.

For example, in some embodiments with defense layer(s), a defense layer may be a non-active layer in the semiconductor device (meaning that the defense layer may necessarily be a different layer than an active layer, including little or no electrical element(s)). Similarly, for example, in some embodiments with defense pair(s), neither layer in a defense pair may be an active layer. In some other embodiments, a defense layer may be an active layer, and/or a defense pair may include at least one active layer.

For example, in some embodiments, additionally or alternatively, a defense layer may be neither an interconnect layer nor a protection layer. Similarly, for example, in embodiments with defense pair(s), neither layer in the defense pair may be an interconnect layer nor a protection layer. In some other embodiments, a defense layer may be an interconnect layer or a protection layer, e.g. in embodiments including a defense layer that has features of a defense layer such as lattice constants as will be described below and also features of an interconnect layer or a protection layer such as the features discussed above. Similarly, in some other embodiments, one or both layer(s) in a defense pair may be an interconnect layer or a protection layer.

For example, in some embodiments, additionally or alternatively, if more than one defense layer are included in the semiconductor device, then the various defense layers may or may not be contiguous. Similarly, for example in some embodiments with defense pair(s), if more than one defense pair are included in the semiconductor device, then the various pairs may or may not be contiguous.

For example, in some embodiments, additionally or alternatively, a defense layer may or may not be embedded in bulk layer(s), e.g. as a layer between two bulk layers. Similarly, for example in some embodiments with defense pair(s), one or both layers of defense pair may or may not be embedded in bulk layer(s). An embedded defense layer or pair is not referred to herein as a "bulk layer" or "bulk pair", because even if a defense layer or pair may possibly provide mechanical support (e.g. when there is no thinning attack), the main role of a defense layer or pair in accordance with embodiments of the subject matter is defense. Nevertheless, in some cases, a defense layer or one or both layers in a defense pair may be considered to be part of the bulk layer(s), for example if embedded between bulk layer(s) whose main role is mechanical support.

For example, in some embodiments, additionally or alternatively, a defense layer or pair may or may not be below the active layer(s). Continuing with the example, a defense layer or pair may be: below all of the active layer(s); above all of the active layer(s); or in between various active layer(s). In some of such embodiments, at least one defense layer or pair may, for instance, be above the interconnect layer(s).

For example, in some embodiments, additionally or alternatively, a defense layer may not be directly above and/or below an active layer, meaning that in such embodiments there may be at least one layer between a defense layer and any active layer, e.g. in order to prevent or lessen an influence by a defense layer on an active layer under normal circumstances (e.g. when there is no thinning attack). For instance, assuming that there may be active layer(s) above and/or active layer(s) below a particular defense layer, there may be at least one non-active/non-defense layer between the closest active layer that is above the particular defense layer and the particular defense layer, and/or there may be at least one non-active/non-defense layer between the closest active layer that is below the particular defense layer and the particular defense layer.

However, in some other embodiments a defense layer may be directly above and/or directly below an active layer. Similarly, depending on the embodiment, a defense pair may not be directly above and/or below an active layer, or may be directly above and/or below an active layer. In some embodiments, additionally or alternatively, there may be only one layer or only a small number of layers between a defense layer and the closest active layer above and/or below the defense layer, in order to cause or maximize an influence of a defense level on an active layer under abnormal circumstances (e.g. during a thinning attack). However, in other embodiments, there may be a large number of layers between a defense layer and the closest active layer above and/or below the defense layer. Similarly, depending on the embodiment, there may be only one or only a small number of layers between a defense pair and the closest active layer above and/or below the defense pair, or there may be a large number of layers between a defense pair and the closest active layer above and/or below the defense pair.

For example, in some embodiments, additionally or alternatively a defense layer may not be the topmost or the bottommost layer of the semiconductor device. There may be an advantage to a defense layer that is not the topmost or bottommost layer of a semiconductor device, as such a defense layer may be harder for an attacker to discern. For example, the attacker may try to thin the semiconductor device, only to have at least part of the device break, without realizing that the breaking is caused by defense layer(s). Similarly in some embodiments, neither layer in a defense pair may be a topmost or bottommost layer. However in other embodiments, defense layer(s) or layer(s) in defense pair(s) may be a topmost and/or bottommost layer. For instance, in some cases it may be considered advantageous for a defense layer or pair to be more easily discernable (visible) as such visibility may possibly discourage an attack.

As mentioned above, in some embodiments one or more wafers may be used for at least some of the layers of a semiconductor device. A wafer may be made up of many single units called dies. In such embodiments, the fabrication of the semiconductor device may therefore include: fabrication while the dies are still on the wafer(s); and/or fabrication after the dies are diced, or in other words separated from one another (e.g. by sawing the wafer(s)). In such embodiments, for example, additionally or alternatively, defense layer(s) and/or pair(s) may be fabricated: while the semiconductor device is still connected to other devices in a wafer or wafers; and/or after the device has been separated from other devices. In some cases it may be advantageous to fabricate the defense layer(s) and/or pair(s) while the semiconductor device is still connected on wafer(s) rather than after separation from other semiconductor devices on the wafer(s), so that defense layer(s) and/or pair(s) may be fabricated in parallel for the entire wafer(s). Additionally or alternatively, it may be advantageous so that the defense layer(s) and/or pair(s) may be fabricated closer in time to the time of fabrication of the other layer(s) of the device, which are typically although not necessarily fabricated while the semiconductor device is still connected on the wafer(s). For instance, it may be easier to adapt similar techniques used for fabricating other layer(s) of the device (e.g. active layer(s)) to fabricating the defense layer(s) and/or pair(s), if such adaptation is desirable, if the defense layer(s) and/or pair(s) are fabricated closer in time to the time of fabrication of other layer(s) of the device. However, in other cases, it may be advantageous to fabricate the defense layer(s) and/or pair(s), after dicing, for instance, at a manufacturing facility that specializes in such fabrication.

In some embodiments, the defense layer(s) and/or pair(s) may not be added during the packaging stage of the semiconductor device but rather before. In some cases, it may be advantageous not to add defense layer(s) and/or pair(s) during packaging as layer(s) and/or pair(s) added during packaging may be more easily discerned. In some other embodiments, there may be no such restriction.

The height (also referred to as "depth") of the semiconductor device and/or the layers within may vary depending on the example. However for the sake of further illustration to the reader some examples are now provided. For example the active layer(s) may be about 50 to 300 nanometers. For another example, the metal interconnect layer(s) may be about 50 to 300 nanometers. For another example, each defense layer or layer in a defense pair may be about 1 micron or less. For another example, the bulk layer(s) may be about 100 to 200 microns. For another example, protection layer(s), if included, may be about a few microns.

Depending on the embodiment, mismatched (or in other words different or dissimilar) lattice constants may characterize a defense layer or pair because of the use of different materials. Additionally or alternatively, mismatched lattice constants may characterize a defense layer or pair because of the use of the same material having different crystallographic orientations (also referred to as "crystallographic directions" or simply "orientations"). The term mismatch is used herein to mean "difference" or "dissimilarity", and the term does not necessarily imply a negative quality to the difference. The term mismatch also does not imply how different mismatched items (e.g. lattice constants) may be and the characteristics of the mismatch (e.g. amount of mismatch and/or direction of mismatch) may vary depending on the embodiment. See for instance, the discussion below regarding amount and direction of mismatch with reference to stage 610 of FIG. 6. In some cases, it may be possible that certain (different) materials and/or crystallographic directions in a defense layer or pair may share the same lattice constant. In such cases, the mismatch may be between the (shared) lattice constant and other lattice constant(s) characterizing the defense layer or pair, the mismatched lattice constants characterizing the defense layer or pair e.g. because of the use of different materials and/or crystallographic orientations.

In some embodiments, one lattice constant may characterize the defense layer(s) and/or the defense pair(s) because of the use in the defense layer(s) and/or pair(s) of a semiconductor material that is included as a primary material in the active layer(s) and is included in the bulk layer(s). For example, if the primary material is silicon, then one lattice constant may characterize the defense layer(s) and/or the defense pair(s) because of the use of silicon, and at least one other lattice constant may characterize the defense layer(s) and/or the defense pair(s) because of the use of e.g. silicon carbide, silicon germanium, etc. In some other embodiments, there may be no such restriction on lattice constants. In some embodiments, if a defense layer or a layer in a defense pair is also an active layer, one of the lattice constants may characterize the defense layer (or the lattice constant may characterize the layer in the defense pair that is an active layer) because of the use of a semiconductor material that is included as a primary material for the active layer. In some other embodiments, there may be no such restriction on lattice constants.

In some embodiments relating to defense pair(s), if a layer from the defense pair is directly above or below an active layer, there may be a restriction that the layer from the defense pair that is directly above or below the active layer be characterized by the same lattice constant as the primary material in the active layer. Such a restriction may be set in order to prevent or minimize the probability of enhancement or diminishment of a destabilizing force (see below for more details), the enhancement or diminishment caused by the different lattice constants in the active layer and the layer in the defense pair directly above or below the active layer. Additionally or alternatively such a restriction may be set in order to prevent or minimize the probability of an effect on the electrical characteristics (e.g. hole mobility, electron mobility, etc.) of electrical elements in the active layer. However, in other embodiments, there may be no such restriction on lattice constants.

Figure 6:
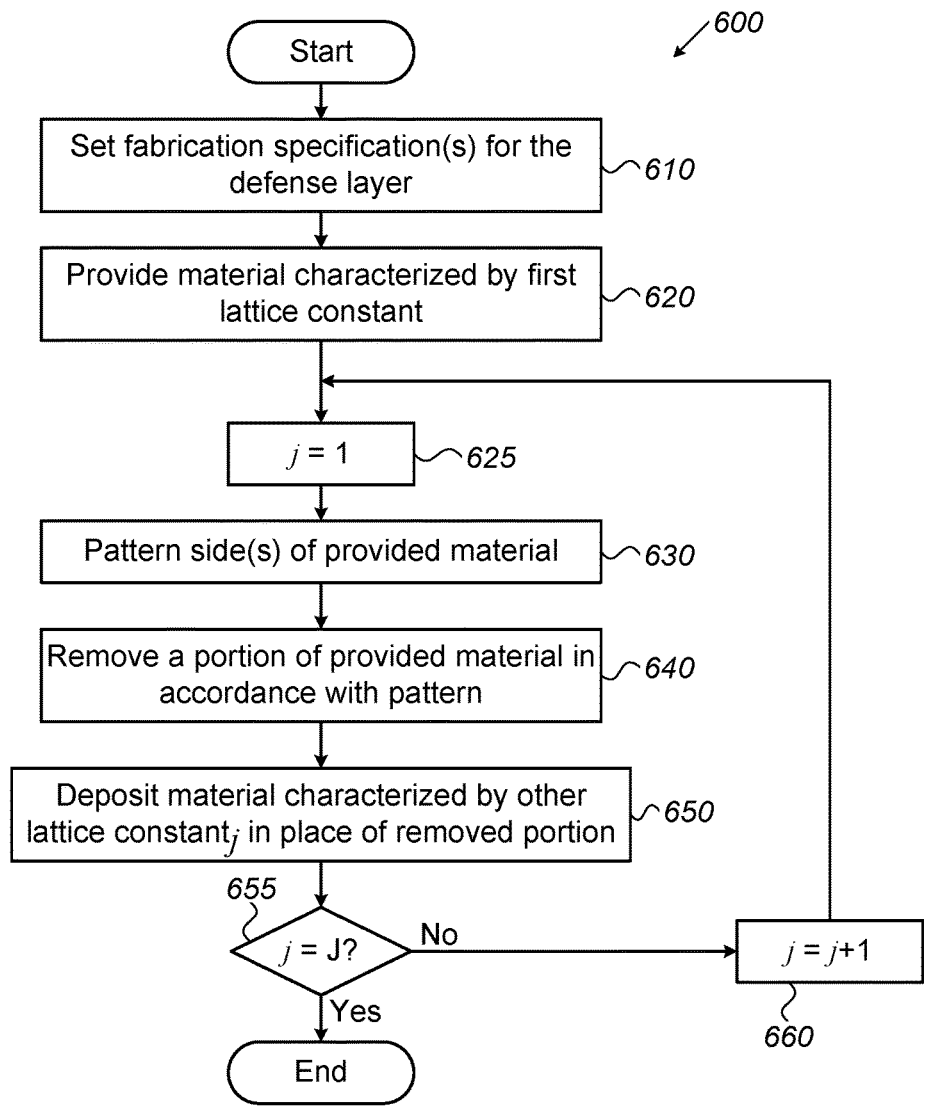
FIG. 6 is a flowchart of a method of fabricating defense layer(s), in accordance with some embodiments of the presently disclosed subject matter.

Further details regarding parameters which may be considered, e.g. relating to placement and/or makeup of the defense layer(s) and/or pair(s) are discussed further below, e.g. with reference to stage 610 (FIG. 6).

In embodiments with one or more defense layer(s), rather than one or more defense pair(s) of layers, each defense layer may be characterized by at least two lattice constants that are mismatched. The mismatch in the lattice constants may cause a "destabilizing force" which may include a tensile force and/or a compressive force. Referring now to embodiments with one or more defense pairs, each defense pair may include two layers that have lattice constants mismatched from each other. The mismatch in the lattice constants may causes a destabilizing force which may include a tensile force and/or a compressive force.

For simplicity's sake, the term "destabilizing force" is used herein for a force which may comprise at least one of a tensile force or a compressive force. In embodiments described herein, the use of the singular form of the word "force", e.g. with reference to a destabilizing force, a tensile force, a compressive force, a stiffening force, etc. should be understood to include situations in which there may be a single force and/or situations in which there may be a plurality of forces, e.g. relating to different segments of a layer, different layers, and/or different pairs of layers, etc. For example, mismatched lattice constants characterizing a plurality of defense layers and/or pairs may be considered to cause a single destabilizing force and/or may be considered to cause a plurality of destabilizing forces, but herein the resulting destabilizing force is referred to in the singular form. As another example, a destabilizing force due to mismatched lattice constants in a defense layer or pair is referred to herein as possibly being enhanced or diminished because of a difference from lattice constant(s) in other layer(s), rather than considering the difference from lattice constant(s) in other layer(s) as causing a separate destabilizing force.

Furthermore, when it is stated that a destabilizing force may include at least one of tensile force or a compressive force (or in other words, a tensile force and/or a compressive force), it should be understood that the destabilizing force may include a tensile force, a compressive force, or any combination (by way of any appropriate function) of a compressive force and a destabilizing force. Although a destabilizing force is so called because the force may have the potential to destabilize the semiconductor device, e.g. by causing a break, as will be described in more detail below, it should not be assumed that the force necessarily has the characteristics implied by the name thereof. A tensile force may be an outward or stretching force whereas a compressive force may be an inward or pushing force. Stress and strain are defined in various ways in the art, and therefore will not be used herein to describe a defense layer or a layer in a defense pair, but in accordance with some of the definitions a defense layer or a layer in a defense pair may be considered to be a strained layer and/or a stressed layer.

It is noted that certain techniques that may be used in an active layer to affect the electrical characteristic(s) of electrical element(s) in the active layer may result in the active layer being characterized by two lattice constants. For example, the active layer may include silicon and at least one other material such as silicon carbide, silicon germanium, etc. Additionally or alternatively, certain techniques that may be used in an active layer to affect the electrical characteristic(s) of electrical element(s) in the active layer, may result in the active layer and another layer being characterized by two lattice constants, e.g. the active layer including silicon and the other layer including silicon germanium.

However, the techniques that are used to affect the electrical characteristics are intended to cause a resulting tensile and/or compressive force to be (fully) exerted during fabrication of the device, in order to improve the electrical characteristics of the device, without causing breaking in the semiconductor device. For example, consider the known usage of "strained" silicon to improve performance of transistors. In some techniques, silicon may be removed from two small trenches (e.g. a process referred to as recess etch) at the drain and source, and another material, such as silicon germanium (e.g. $Si_{1-x}Ge_x$) or silicon carbide may be deposited therein (e.g. by chemical vapor deposition). The mismatch in the silicon to silicon germanium or silicon carbide lattice may cause the silicon channel to be under a compressive force or a tensile force. In other techniques, a layer of silicon may be deposited over a layer of silicon germanium. The silicon lattice may have a tendency to be aligned with the silicon germanium and may therefore stretch out, or in other words there may be a tensile force on the silicon.

In the above-mentioned techniques for a transistor, the resulting compression and/or extension may increase performance, for instance due to an increase in hole mobility and/or electron mobility. For example, electrons may move faster in silicon that has been stretched out. It is noted that in such techniques the compressive force and/or tensile force is not meant to be restrained, but rather is meant to be exerted unchecked on the silicon already during fabrication of the transistor. The force causes the silicon to change (e.g. compress and/or extend) the lattice, by reducing and/or increasing the distance between the atoms of silicon from the usual interatomic distance, in order to be aligned with the other material (e.g. silicon germanium or silicon carbide). However, the quantity of the other material that is deposited may be limited so as to avoid any breakage in the semiconductor device.

The techniques described in the paragraphs directly above may or may not be adapted for fabricating defense layer(s) and/or defense pair(s) of layers in a semiconductor device, in accordance with some embodiments of the presently disclosed subject matter. However, in contrast to the techniques described above for fabricating transistors, when fabricating defense layer(s) and/or pair(s), it may be intended that the resulting destabilizing force (the destabilizing force comprising a compressive force and/or a tensile force) be at least partly restrained during fabrication of the defense layer(s) and/or pair(s). Furthermore, it may be intended that the destabilizing force also be at least partly restrained after fabrication of the semiconductor device that includes the defense layer(s) and/or pair(s), under normal circumstances, e.g. as long as the device is not being thinned during an attack. The destabilizing force may be said to be at least partly restrained if the lattices (e.g. in the layer(s) and/or pair(s) of layers) are unchanged or not as much changed due to the destabilizing force, compared to a situation where the destabilizing force is unrestrained. For example, if an unrestrained destabilizing force would have caused lattices of different lattice constants to be completely aligned with one another (e.g. by way of compression and/or extension of one or more of the lattice(s)), then an at least partly restrained destabilizing force may not cause lattices of different lattice constants to be completely aligned with one another (e.g., because there may be no compression and/or extension of lattice(s) or because there may be less compression and/or extension of lattice(s) than for an unrestrained destabilizing force).

Some embodiments of the presently disclosed subject matter may therefore include an at least partial restraining of a destabilizing force. It is assumed that if the destabilizing force were instead unrestrained, breakage would have occurred as lattice(s) compressed and/or extended. Therefore, in order to keep the defense layer(s) and/or pair(s) intact in the semiconductor device, at least a sufficient part of the destabilizing force may be restrained, except under certain abnormal circumstances (e.g. a thinning attack). A part of the destabilizing force that is restrained may be termed "sufficient", if sufficient to keep the defense layer(s) and/or defense pair(s) of layers intact under normal circumstances (e.g. when there is no thinning attack). For instance, the sufficient part may in some cases be the entire destabilizing force. In some other cases, the sufficient part may be less than the entire destabilizing force. For example, if the defense layer(s) and/or defense pair(s) of layers may remain intact under normal circumstances even when up to a certain portion of the entire destabilizing force is unrestrained, then the sufficient part may be at least partly dependent on the entire destabilizing force and the certain portion. Continuing with the example, and assuming only a tensile force or only a compressive force, the sufficient part may equal approximately the difference between the entire destabilizing force and the certain portion. The certain portion may be dependent on the degree (e.g. magnitude of force and/or whether the force includes a tensile force and/or a compressive force) of destabilizing force required to break at least part of at least one defense layer (or at least part of at least one layer in at least one defense pair). For instance, assuming only a tensile force or only a compressive force, the magnitude of the certain portion may be less than the magnitude of the destabilizing force required to break the at least part.

Stiffness of a semiconductor device may be dependent, at least partly, on thickness of the device, e.g. thickness of at least one of the layers of the device. For example, stiffness may be proportional to the cube of thickness. Stiffness may additionally or alternatively be at least partly dependent on other factor(s) such as object(s) used during fabrication of the device, hardness of material(s) of layer(s) of the device, and/or x-y dimensions of layer(s) of the device, etc.

For ease of understanding of some embodiments of the subject matter, and perhaps unconventionally, a force is introduced herein with some features that are "borrowed" from the concept of stiffness. The force may be assumed to be dependent, at least partly, on the thickness of the semiconductor device (e.g. thickness of at least one of the layers of the device). The force may additionally or alternatively be assumed to be at least partly dependent on other factor(s) such as object(s) used during fabrication of the device as will be described in more detail below; hardness of material(s) in layer(s) of the device; and/or x-y dimensions of layer(s) of the device; etc. For ease of referral below the force is termed herein below "stiffening force". Since thickness of the device may be changed during a thinning attack, the at least partial dependence of the stiffening force on thickness may be emphasized more than possible other factor(s) in the description below. The stiffening force may be assumed to counter the destabilizing force and restrain at least a sufficient part of the destabilizing force to keep the defense layer(s) and/or defense pair(s) of layers intact under normal circumstances (e.g. when there is no thinning attack).

In some embodiments it may be possible that the device may be fabricated so that initial thinning of the device during an attack may not necessarily cause breakage, for instance in order to avoid breakage in case of a limited amount of non-malicious thinning that is not part of an attack. In such embodiments, during the initial thinning in an attack, at least a sufficient part of the destabilizing force to keep the defense layer(s) and/or defense pair(s) intact may continue to be restrained. For instance, the stiffening force may be assumed to be proportional to the cube of the thickness, e.g. of all layers of the device other than the defense layer(s) and/or defense pair(s). A thicker device may therefore have a larger initial stiffening force, and may need to be thinned more than a thinner device e.g. before the stiffening force lessens enough to allow any of the restrained destabilizing force to no longer be restrained. Continuing with the instance, the stiffening force may be further assumed to be larger than the restrained destabilizing force. In such an instance, the stiffening force may need to be reduced to, say, below the restrained destabilizing force before any of the restrained destabilizing force may stop being restrained. However, even in such an instance, reducing the stiffening force to below the restrained destabilizing force may not necessarily cause breakage. It may be possible that the stiffening force may need to be lessened past the level of just below the restrained destabilizing force before breakage may occur, e.g. because the destabilizing force that was restrained may have been more than sufficient for keeping the defense layer(s) and/or pair(s) intact.

In another instance, a part of the destabilizing force may not have been restrained (e.g. due to the stiffening force being less than the destabilizing force) but the unrestrained part may not have been enough to cause breakage, because at least a sufficient part of the destabilizing force may have been restrained. In such an instance a small amount of thinning in an attack that lessens the stiffening force may in some cases be enough to cause breakage.

In embodiments herein it may hence be stated that "at least some" of the destabilizing force that was restrained may no longer be restrained and consequently breakage may occur. The phrase "at least some" may therefore be considered to be indicative of a degree of restrained destabilizing force (e.g. magnitude of force and/or whether the force includes a tensile force and/or a compressive force) that when no longer restrained may cause breakage, where such a degree may vary depending on the embodiment. For example, assume that no longer restraining the "at least some" of the destabilizing force that was restrained may cause as least part of at least one defense layer (or at least part of at least one layer in at least one defense pair) to break. In such an example, the degree represented by the phrase "at least some" may at least partly depend, e.g. on the degree of destabilizing force required to break the at least part; and/or on the degree (if any) of the destabilizing force that was not restrained (e.g. the certain portion of the destabilizing force referred to above) to which may be combined (by any appropriate function) any restrained destabilizing force which may become no longer restrained due to thinning in an attack. It may be assumed, however, that if the defense layer were properly fabricated, e.g. so as to result in an adequate destabilizing force, the thinning during a thinning attack may eventually lead to breakage. See discussion below of stage 610 (FIG. 6) regarding various parameters, several of which may additionally or alternatively influence breakage.

It may be possible that thinning which may lead to breakage may not be part of an attack. However, in some of the embodiments described herein such thinning may be associated with an attack. An association between thinning and an attack may be reasonable because after a device has been fabricated, thinning that may occur may typically (although not necessarily) occur during an attack. As mentioned above, it may be possible that a limited amount of thinning may not lead to breakage, in case the thinning is non-malicious.

Therefore, in some embodiments, a semiconductor device may comprise: one or more defense layers, the one or more defense layers each characterized by at least two lattice constants that are mismatched, wherein a mismatch in the lattice constants causes a destabilizing force that comprises at least one of: a tensile force or a compressive force. In such embodiments, the device may further comprise a plurality of other layers. In such embodiments at least a sufficient part of the destabilizing force may be restrained for the one or more defense layers to remain intact unless reduction in thickness of at least a section of one or more of the plurality of other layers causes at least some of the destabilizing force that was restrained to no longer be restrained, and consequently at least part of at least one of the one or more defense layers to break.

Additionally or alternatively, in some embodiments, a semiconductor device may comprise one or more defense pairs of layers, each of the one or more defense pairs including two layers that are not topmost or bottommost layers of the semiconductor device, that are not active, and that are characterized by lattice constants that are mismatched from each other, wherein a mismatch in the lattice constants causes a destabilizing force that comprises at least one of: a tensile force or a compressive force. In such embodiments, the device may further comprise a plurality of other layers, including: one or more active layers, each comprising at least one semiconductor material. In such embodiments the one or more defense pairs of layers may be below all of the one or more active layers, and if any layer in any of the one or more defense pairs is directly below any of the one or more active layers, the layer that is directly below the active layer may be characterized by the same lattice constant as a primary material used in the active layer. In such embodiments, at least a sufficient part of the destabilizing force may be restrained for the one or more defense pairs of layers to remain intact unless reduction in thickness of at least a section of one or more of the plurality of other layers, causes at least some of the destabilizing force that was restrained to no longer be restrained, and consequently at least part of at least one layer in at least one of the one or more defense pairs to break.

Although the subject matter may include embodiments with defense layer(s) and/or pair(s), there may be advantages to one and/or the other. For example, it may be advantageous for a semiconductor device to include a defense layer characterized by mismatched lattice constants, rather than a pair of layers characterized by mismatched lattice constants. First, there may be more flexibility in placement of the defense layer within the semiconductor device, as taking into account the lattice constant(s) of bordering (also referred to herein as "contiguous") layers may not be necessary or may be less necessary. As will be described in more detail below, one or more other (e.g. contiguous) layer(s) being characterized by lattice constant(s) that may be different from lattice constant(s) characterizing the defense layer, may in some cases cause a destabilizing force (caused by mismatched lattice constants within a defense layer) to be enhanced or diminished. Therefore, in such cases, the destabilizing force may be enhanced or diminished compared to some other scenarios (e.g. when lattice constant(s) of other layers are not of concern). However, in some of such cases it may be attempted in the method of fabricating the defense layer to minimize any enhancement or diminishment. For instance, if only the material characterized by one of the lattice constants in a defense layer borders any layer above and/or below, then in some cases only the one lattice constant may be of concern when considering lattice constant(s) of layer(s) above and/or below. In contrast, in a defense pair, each layer in the pair has a different lattice constant and may border another layer, so both lattice constants in the pair may be of concern when considering the layer(s) above and/or below the pair.

Second, a pattern that may define location and/or distribution of adjacent material with mismatched lattice constants within a defense layer may allow better fine-tuning of the destabilizing force. For instance, if due to the pattern the amount of adjacent material with mismatched lattice constants within a defense layer may be larger than had the adjacent material been at the boundary between layers of a defense pair, then the destabilizing force due to the defense layer may possibly be larger than a destabilizing force due to the defense pair. Similarly, for instance, if due to the pattern the amount of adjacent material with mismatched lattice constants within a defense layer may be smaller than had the adjacent material been at the boundary between layers of a defense pair, then the destabilizing force due to the defense layer may possibly be smaller than a destabilizing force due to the defense pair.

Third, a defense layer may in some cases be characterized by more than two mismatched lattice constants (although only two is certainly possible), whereas each layer of the pair may be typically although not necessarily be characterized by one lattice constant. The possibility of more than two mismatched lattice constants may allow better fine tuning of the destabilizing force.

There may be advantages to including one or more defense pair(s) of layers, where layers of a pair have lattice constants that are mismatched from each other, in addition to or instead of defense layer(s). For example, it may be easier to fabricate each layer in a pair characterized a single lattice constant (e.g. each layer in the pair including a different material or the same material but with a different crystallographic orientation), rather than fabricating a layer characterized by at least two lattice constants.

Referring now to the figures, FIG. 1 is a flowchart of a method 100 of fabricating a semiconductor device, in accordance with some embodiments of the presently disclosed subject matter.

For simplicity's sake method 100 will now be described with reference to defense layer(s) rather than defense pair(s) of layers. However a similar method may be used to fabricate a semiconductor device that includes defense pair(s) in addition to or instead of defense layer(s), mutatis mutandis.

For simplicity's sake, some of the examples below refer to wafers, e.g. slices of a certain semiconductor material such as silicon, where the active layer and many, if not all, of the non-active layers include the certain semiconductor material, e.g. silicon. However, as mentioned above, the material(s) used in the layers may vary depending on the embodiment. Furthermore, some of the examples below refer to dies (whether on a wafer or after dicing), as examples of semiconductor devices, where each die is an individual semiconductor device. However in some embodiments a semiconductor device may not necessarily be a die.

FIG. 1 will be described in conjunction with FIG. 2 (namely 2A, 2B and 2C), FIG. 3 (namely, 3A, 3B and 3C), FIG. 4 (namely 4A and 4B) and FIG. 5 (namely 5A, 5B, and 5C). For simplicity's sake, each of FIGS. 2 to 5 depicts a single defense layer, although depending on the embodiment there may be one or more defense layer(s). Also for simplicity's sake, FIGS. 2 to 5 depict the defense layer as a non-active layer. More details regarding a defense layer that may also be an active layer are provided elsewhere herein. Furthermore, for simplicity's sake, FIGS. 2 to 5 depict the defense layer as a different layer than the interconnect and protection layers, although a defense layer may in some cases be an interconnect or protection layer. As mentioned above, even when a defense layer is embedded in bulk layer(s), the defense layer is not referred to herein as a bulk layer as the main role of the defense layer is not mechanical support but defense, and therefore the defense layer is depicted as a different layer than the bulk layer(s). However as mentioned above, a defense layer may be considered in some cases to be part of the bulk layer(s). FIGS. 2 to 5 may not necessarily be drawn to scale, nor in correct proportion to one another.

In stage 110, first support may be provided. Defense layer(s) in the semiconductor device may remain intact while being fabricated at least partly due to the first support.

For instance, the previously introduced stiffening force may be assumed to be at least partly dependent on the first support while the defense layer(s) is being fabricated. The stiffening force may be assumed to be exerted, keeping the defense layer(s) intact while the defense layer(s) is being fabricated. Whether or not first support contributes to keeping the defense layer(s) intact after fabrication of the defense layer(s) may depend on the embodiment, e.g. on whether or not first support is later removed.

The first support that may be provided may vary depending on the example, but for the sake of further illustration to the reader some examples are now provided.

Figure 2A:
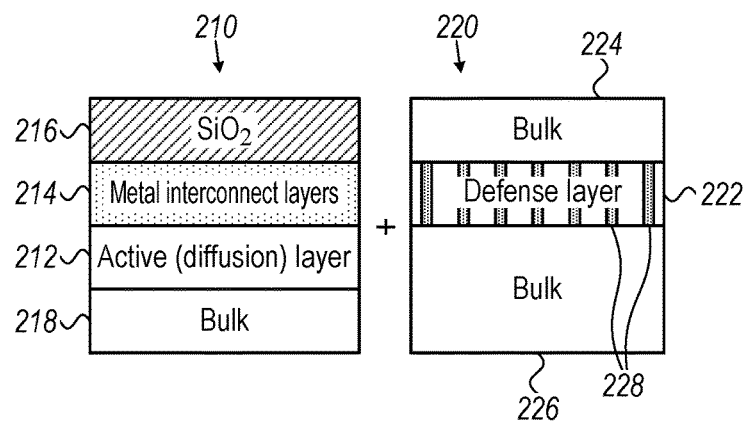
FIG. 2A illustrates an example of first support and a defense layer, in accordance with some embodiments of the presently disclosed subject matter.

Refer to FIG. 2A which illustrates an example of first support and a defense layer, in accordance with some embodiments of the presently disclosed subject matter.

In FIG. 2A, cross sections of two wafers 210 and 220 are shown. The wafers may be silicon wafers. Wafer 210 may include previously formed layers such as: active (diffusion) layer(s) 212 e.g. including the electrical elements, metal interconnect layer(s) 214, protection layer(s) 216 directly above metal interconnect layer(s) 214, and bulk layer(s) 218 directly below the active layer(s) 212. Wafer 220 may include a defense layer 222 in between two bulk layers, namely a bulk layer 224 directly above defense layer 222 and a bulk layer 226 directly below defense layer 222. Bulk layer 224 and/or bulk layer 226 may be considered to be first support, as defense layer 222 may remain intact while being fabricated at least partly due to the thickness of bulk layer 224 and/or 226. For instance, bulk layer 226, at least, may be thicker than a typical bulk layer. The previously introduced stiffening force, for example, may be assumed to be at least partly dependent on the thickness of bulk layer 224 and/or bulk layer 226. The stiffening force may be assumed to be exerted to counter the destabilizing force, restraining at least a sufficient part of the destabilizing force for the defense layer 222 to remain intact during fabrication. Embodiments of a method of fabricating a defense layer such as the defense layer 222 will be described further below with reference to FIG. 6.

FIG. 3A illustrates another example of first support, in accordance with some embodiments of the presently disclosed subject matter.

In FIG. 3A a cross section of a wafer segment 310 including two dies 312 and 314 is shown. The wafer, of which segment 310 is shown, may be a silicon wafer. A depression 316 may be made at a boundary between dies 312 and 314. Depression 316 may be made along all of the boundary or only along a portion of the boundary, e.g. where the portion may at least include the part of the boundary near where the defense layer may be later fabricated. In FIG. 3A, depression 316 is shown on an upper part of the boundary, where layers of the device may later be fabricated. Depression 316 may be filled with a hard material 318 (e.g. a metal used in fabrication of the semiconductor device and/or having a different lattice constant than any lattice constant(s) that will be used in the defense layer). Hard material 318 may or may not be on a right boundary of die 314 and/or a left boundary of die 312, in addition to or instead of being on the boundary between dies 312 and 314.

Hard material 318 may be an example of first support that may be provided. Additionally or alternatively, one or more layer(s) of dies 312 and 314 (e.g. previously formed silicon bulk layer 320) shown in FIG. 3A and therefore included in dies 312 and 314 before the defense layer is fabricated, may be examples of first support that may be provided. For example, the previously introduced stiffening force may be assumed to be at least partly dependent on object 318 (e.g. on dimensions and/or hardness of hard material 318) and/or on thickness of layer(s) shown in FIG. 3A. The stiffening force may be assumed to be exerted to counter the destabilizing force, restraining at least a sufficient part of the destabilizing force for the defense layer to remain intact during fabrication.

FIG. 4A illustrates another example of first support, in accordance with some embodiments of the presently disclosed subject matter.

In FIG. 4A, a cross section of a wafer segment 410 including two dies 412 and 414 is shown. The wafer, of which segment 410 is shown, may be a silicon wafer. In FIG. 4A, dies 412 and 414 may already include active (diffusion) layer(s) 434, metal interconnect layer(s) 432, and protection layer(s) 430 directly above metal interconnect layer(s) 432 in addition to bulk layer(s) 436 directly below the active layer(s) 434. A depression 416 may be made at the boundary between dies 412 and 414. Depression 416 may be made along all of the boundary or only along a portion of the boundary, e.g. where the portion may at least include the part of the boundary near where the defense layer may be later fabricated. In FIG. 4A depression 416 is shown on a lower part of the boundary, where the defense layer may be later fabricated. Depression 416 may be filled with a hard material 418 (e.g. a metal used in fabrication of the semiconductor device and/or having a different lattice constant than any lattice constant(s) that will be used in the defense layer).

Hard material 418 may or may not be on a right boundary of die 414 and/or a left boundary of die 412, in addition to or instead of being on the boundary between dies 412 and 414. Hard material 418 may be an example of the first support. Additionally or alternatively, one or more layer(s) of dies 412 and 414 (e.g. any of previously formed layers 430, 432, 434, and/or 436) shown in FIG. 4A and therefore included in dies 412 and 414 before fabricating the defense layer may be examples of first support. For example, the previously introduced stiffening force may be assumed to be at least partly dependent on object 418 (e.g. on dimensions and/or hardness of hard material 418) and/or on thickness of layer(s) shown in FIG. 4A. The stiffening force may be assumed to be exerted to counter the destabilizing force, restraining at least a sufficient part of the destabilizing force for the defense layer to remain intact during fabrication.

Figure 5A:
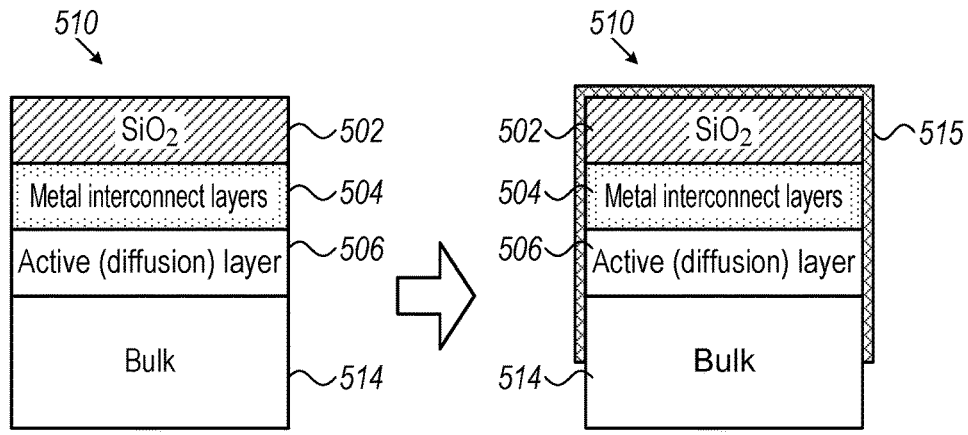
FIG. 5A illustrates another example of first support, in accordance with some embodiments of the presently disclosed subject matter.

FIG. 5A illustrates another example of first support, in accordance with some embodiments of the presently disclosed subject matter.

In FIG. 5A, a cross section of a die 510 is shown, e.g. after a wafer has been diced, separating die 510 from the wafer.

Die 510 may be placed inside an external gripper 515 (e.g. an external case). Gripper 515 may grip at least part of the edge around die 510. For instance gripper 515 may leave a section of the edge of the die un-gripped, e.g. exposed, to allow further fabrication on die 510 such as of a defense layer. In FIG. 5A, the section of the edge along the bottom of the die 510 is shown exposed. Gripper 515 may be an example of the first support. Additionally or alternatively, one or more of the previously formed layer(s) of die 515 (e.g. from top to bottom: protection layer(s) 502, metal interconnect layer(s) 504, active (diffusion) layers 506 and/or bulk layer(s) 514) shown in FIG. 5A and therefore included in die 510 prior to fabricating the defense layer may be an example of first support. For example, the previously introduced stiffening force may be assumed to be at least partly dependent on object 515 (e.g. on dimensions, and/or hardness of material of gripper 515) and/or on thickness of layer(s) shown in FIG. 5A. The stiffening force may be assumed to be exerted to counter the destabilizing force, restraining at least a sufficient part of the destabilizing force for the defense layer to remain intact during fabrication.

In stage 120 of FIG. 1 one or more defense layer(s) may be fabricated.

The positioning of the defense layer(s) in the semiconductor device and how the defense layer(s) may be made, may vary depending on the example but for the sake of further illustration to the reader some examples are now provided.

Refer to FIG. 6, which is a flowchart of a method 600 of fabricating defense layer(s), in accordance with some embodiments of the presently disclosed subject matter.

For simplicity's sake, method 600 will be described with reference to defense layer(s) rather than defense pair(s) of layers. However a similar method may be used to fabricate a semiconductor device that includes defense pair(s), in addition to or instead of defense layer(s), mutatis mutandis. Furthermore, for simplicity's sake, method 600 will be described with reference to a particular defense layer.

In stage 610, fabrication specification(s) for the defense layer may be set. In some cases, at stage 610 or prior to stage 610, various parameters relating to the semiconductor device may be considered and value(s) for the various parameter(s) may be determined. The determined value(s) may be translated into certain specification(s) for fabricating the defense layer (or in other words, the specification(s) may be set at least partly based on the value(s)). The parameters may vary depending on the instance, but for the sake of further illustration to the reader, some instances of parameters are now provided.

For instance, the amount of mismatch between lattice constants may be considered as a parameter. Reference to consideration of the amount of mismatch may be construed as including embodiments where there may be consideration of sub-amounts of mismatch (e.g. between subsets of the lattice constants), for example if three or more lattice constants are involved. The amount of mismatch between lattice constants characterizing the defense layer may be considered, as the amount may influence the magnitude of the resulting destabilizing force. In some cases, a target mismatch amount may be selected, e.g. arbitrarily or in accordance with a target magnitude for a destabilizing force, and consequently material(s) and/or crystallographic orientation(s) that may result in the target mismatch amount may be determined. Additionally or alternatively, in some other cases, available material(s) and/or crystallographic orientations(s) may be selected and consequently the amount of mismatch resulting from the material(s)/orientation(s) may be determined. In addition to or instead of the amount of mismatch between lattice constants characterizing the defense layer, in some embodiments, the amount of mismatch (if any) between lattice constant(s) in the defense layer and in the layer(s) above and/or below may be considered as such amount of mismatch may enhance or diminish the destabilizing force. However, in some other embodiments such amount may be ignored, as the enhancement or diminishment may be assumed to be insignificant relative to the unenhanced and undiminished destabilizing force. For example, if only two lattice constants are considered, the amount of mismatch may be computed in some embodiments as e.g. lattice constant 1 minus lattice constant 2

(where the difference may be large or small, depending on the lattice constants). However, in some other embodiments, any appropriate computation may be used to compute the amount of mismatch when the layer is characterized by two or more lattice constants.

For another instance, the direction of mismatch between lattice constants may be considered as a parameter. Reference to consideration of the direction of mismatch may be construed as including embodiments where there is consideration of sub-directions of mismatch, for example if three or more lattice constants are involved. The direction of mismatch between lattice constants characterizing the defense layer may be considered, as the direction may influence whether the destabilizing force includes a compressive force and/or a tensile force. If there are more than two lattice constants characterizing the layer, the direction of mismatch may or may not be the same between different pairs of lattice constants, e.g. between a certain lattice constant and another of the lattice constants versus between the certain lattice constant and yet another of the lattice constants. In some cases, a target mismatch direction may be selected, e.g. arbitrarily or in accordance with whether it is desirable that the destabilizing force include a compressive force and/or tensile force, and consequently material(s) and/or crystallographic orientation(s) that may result in the target mismatch direction may be determined. Additionally or alternatively, in some other cases, available material(s) and/or crystallographic orientations(s) may be selected and consequently the mismatch direction resulting from the material(s)/orientation(s) may be determined. In addition to or instead of the direction of mismatch between lattice constants characterizing the defense layer, in some embodiments, the direction of mismatch (if any) between lattice constant(s) in the defense layer and in the layer(s) above and/or below, may additionally or alternatively be considered as such direction may enhance or diminish the destabilizing force. However, in some other embodiments such direction may be ignored, as the effect may be assumed to be insignificant relative to the contribution due to the direction of mismatch between lattice constants characterizing the defense layer.

For another instance, the amount of adjacent material with mismatched lattice constants may be considered as a parameter. The term "adjacent" as used herein means "not distant". Adjacent material with mismatched lattice constants may refer to different materials adjacent to one or another and/or may refer to the same material with different orientations adjacent to one another. The maximum distance for material to be considered adjacent material with mismatched lattice constants may vary depending on the embodiment. Typically although not necessarily, adjacent material with mismatched lattice constants may be material that is close enough that a difference in lattice constants thereof may be relevant (e.g. to a destabilizing force). Reference to consideration of the amount of adjacent material with mismatched lattice constants may be construed as including embodiments where there is consideration of sub-amounts of adjacent material with mismatched lattice constants (e.g. adjacent material for subsets of mismatched lattice constants), for example if three or more lattice constants are involved. The amount of adjacent material with mismatched lattice constants within the defense layer may be considered, as the amount of such adjacent material may influence the magnitude of the destabilizing force.

For example, if a layer includes a grid of material with a given lattice constant, and the remainder of the layer includes a material with another lattice constant, resulting in a large amount of adjacent material with mismatched lattice constants, it may be assumed that the destabilizing force may be larger than if the layer included only one groove of material with the given lattice constant, with the remainder of the layer including the material with the other lattice constant. In some cases, consideration of the amount of adjacent material with mismatched lattice constants, may include consideration of the amount of each material characterized by a different lattice constant (e.g. due to being a different material and/or different orientation), in absolute terms and/or in relative terms to one another. In addition to or instead of the amount of adjacent material with mismatched lattice constant within the defense layer, the amount of adjacent material with mismatched lattice constants (if any) between the defense layer and the layer(s) above and/or below, may additionally or alternatively be considered as such amount may enhance or diminish the destabilizing force. However, in some embodiments such amount may be ignored, as the enhancement or diminishment may be assumed to be insignificant relative to the unenhanced and undiminished destabilizing force.

For another instance, the location in the defense layer of adjacent material with mismatched lattice constants may be considered as a parameter, because location may influence where a break may be more likely to occur. In some cases, adjacent material with mismatched lattice constants or the majority of such adjacent material may be located above or below certain electrical element(s) in the active layer(s) that it may be especially desirable to protect, so that a break may be more likely to occur above or below such elements. In some cases, additionally or alternatively, the adjacent material may be located in many locations in the defense layer, in case thinning occurs at, above or below any of such locations. The overall probability of breakage may in some of such cases be increased compared to a situation where the adjacent material is located in fewer locations in the defense layer and the thinning occurs elsewhere than at, above, or below the locations of the adjacent material. In some cases, additionally or alternatively, if the defense layer is characterized by three or more lattice constants, consideration of the location in the defense layer of adjacent material with mismatched lattice constants may include consideration of the location of adjacent material with a certain amount and/or direction of mismatch versus the location of adjacent material with a different amount and/or direction of mismatch.

For another instance, the distribution in the defense layer of adjacent material with mismatched lattice constants may be considered as a parameter, because the distribution may influence where a break may be more likely to occur. Continuing with the instance, in various embodiments the adjacent material with mismatched lattice constants or the majority of such adjacent material may be concentrated (e.g. in one location or in a few locations); may be uniformly distributed in the defense layer; or may be non-uniformly distributed in the layer. In some cases, selection of the type(s) of distribution may take into account distribution of electrical element(s) in the active layer and/or location of potential thinning. In some cases, additionally or alternatively, if the defense layer is characterized by three or more lattice constants, consideration of the distribution in the defense layer of adjacent material with mismatched lattice constants, may include consideration of the distribution of adjacent material with a certain amount and/or direction of mismatch versus the distribution of adjacent material with a different amount and/or direction of mismatch.

For another instance, the dimensions of the defense layer may be considered as a parameter, because the dimensions may affect the probability of breaking. Continuing with the instance, if a defense layer does not extend over the same width and length as the top and/or bottom of the device, then in some cases there may be less of a probability of breaking upon thinning (because the thinning may occur where the defense layer does not extend) than if the defense layer extended over the same length and width as the top and/or bottom of the device. Additionally or alternatively, if a defense layer is shallow (or in other words thin), then the probability of breaking may be less than if the defense layer is deeper, or in other words thicker (e.g. because less adjacent material with mismatched lattice constants within the layer may translate into a smaller destabilizing force).

For another instance, the thickness of any second support that may be provided (described further below with reference to stage 130 of method 100) and of any first support that may remain (e.g. after fabrication of the device) may be considered as a parameter. The thickness of any second support that may be provided and of any first support that may remain may affect the magnitude of the destabilizing force that may be allowable and/or the probability of breaking. Continuing with the instance, the previously introduced stiffening force may be assumed to be at least partly dependent on the thickness, and may assumed to counter the destabilizing force. Typically although not necessarily, the thicker the support, the larger the stiffening force. A larger stiffening force may restrain a larger destabilizing force or a larger part of a destabilizing force. Therefore, assuming a certain destabilizing force, if there is a larger stiffening force, it may be more likely that at least a sufficient part of the destabilizing force may be restrained to prevent breakage under normal circumstances. Additionally or alternatively, a larger stiffening force that is significantly greater than the restrained destabilizing force may mean that more thinning of the support may need to occur before a break may occur.

For another instance, the material(s) of any second support that may be provided (described further with reference to stage 130 of method 100) and of any first support that may remain (e.g. after fabrication of the device) may be considered as a parameter, because the material(s) may affect the magnitude of the destabilizing force that may be allowable and/or the probability of breaking. For example, the previously introduced stiffening force that may be assumed to be exerted, may be assumed to be at least partly dependent on the hardness and/or on the x-y dimensions of the materials of any provided second support and any remaining first support (in addition to or instead of being at least partly dependent on thickness). Continuing with the example, if the support includes layer(s), the x-y dimensions may be of the layer(s). In the example, typically although not necessarily, the harder the material(s) and/or the larger the x-y dimensions, the larger the stiffening force. A larger stiffening force may restrain a larger destabilizing force or a larger part of a destabilizing force. Therefore, assuming a certain destabilizing force, if there is a larger stiffening force, it may be more likely that at least a sufficient part of the destabilizing force may be restrained to prevent breakage under normal circumstances. Additionally or alternatively, a larger stiffening force that is significantly greater than the restrained destabilizing force may mean that more thinning of the support may need to occur before a break may occur.

For another instance, the distance of a defense layer from the top and/or bottom of the device may be considered as a parameter, because the distance may affect the magnitude of the destabilizing force that may be allowable and/or the probability of breaking. For example, the previously introduced stiffening force may be assumed to be at least partly dependent on thickness, but may be assumed to be affected more by the thickness of the layers above, if such layers are less thick, or by the thickness of the layers below the defense layer, if such layers are less thick. It may be assumed that the defense layer is closer, in one instance to the bottom of the device, and in another instance to the top of the device. In the example, if the thinning is performed, in the first instance from the bottom of the device, or in the second instance from the top of the device, then if the distance from the bottom or from the top to the defense layer is smaller, then the probability of breaking may be more. Additionally or alternatively, in the example, if the distance is smaller, the magnitude of the destabilizing force that may be allowable may be smaller, and/or it may be less likely that at least a sufficient part of the destabilizing force may be restrained to prevent breakage under normal circumstances.

For another instance, the distance of a defense layer that is not an active layer from active layer(s), e.g. from the closest active layer above and/or below the defense layer may be considered as a parameter, because the distance may influence whether or not the defense layer may affect the electrical characteristics of electrical element(s) in the active layer(s), e.g. under normal circumstances (when no thinning attack is taking place). The distance may additionally or alternatively influence whether or not the active layer may break, e.g. if at least some of the destabilizing force that was restrained is no longer restrained. In some cases, there may be at least one layer (e.g. bulk layer, interconnect layer, etc.) between a defense layer and the closest active layer above and/or below the defense layer. For instance, the at least one layer may prevent the defense layer from influencing the electrical characteristics, or at least lessen any such influence, e.g. at least before thinning occurs. In some cases, additionally or alternatively there may be only one layer, or only a small number of layers between the defense layer and the closest active layer above and/or below the defense layer. For instance, one or only a small number of layers may be fabricated between the defense layer and the closest active layer above and/or below the defense layer, so as to increase the probability that at least a portion of the active layer may break if at least some of the destabilizing force that was restrained is no longer restrained.

For another instance, the distribution of electrical element(s) relative to the distribution of adjacent material with mismatched lattice constants may be considered as a parameter. For example, assuming the defense layer is not an active layer, the distribution of electrical element(s) in the active layer(s) relative to the distribution in the defense layer of adjacent material with mismatched lattice constants may be considered as the relative distribution may affect the probability of an active layer breaking at electrical element(s) if at least some of the destabilizing force that was restrained is no longer restrained. Continuing with the instance, it may be desirable to distribute the adjacent material in a similar distribution to the distribution of the electrical element(s), or to the distribution of certain electrical element(s) that it may be especially desirable to protect so that a break in the active layer may be more likely to be near the electrical element(s) or near the certain electrical element(s).

For another instance, location of electrical element(s) relative to location of adjacent material with mismatched lattice constants may be considered as a parameter. For example, assuming the defense layer is not an active layer, the location of electrical element(s) in the active layer(s)

relative to the location in the defense layer of adjacent material with mismatched lattice constants may be considered as the relative location may affect the probability of the active layer breaking at electrical element(s) if at least some of the destabilizing force that was restrained is no longer restrained. Continuing with the instance, it may be desirable to locate the adjacent material with mismatched lattice constants below or on top of electrical element(s), or of certain electrical element(s) that it may be especially desirable to protect so that a break in the active layer may be more likely to be near the electrical element(s) or near the certain electrical element(s).

For another instance, the visibility of the defense layer may be considered as a parameter. In some cases, it may be preferable that the defense layer not be the topmost or bottommost layer in the semiconductor device, as such layers may be more visible. In some of such cases, the defense layer, may be embedded between two layers, e.g. between two bulk layers, or any two layer(s) so as not to be visible from the top or bottom of the device. In some other cases, it may be preferable that the defense layer be visible, e.g. in order to discourage an attack.

It is noted that not all of the parameters discussed in the above instances, may necessarily be relevant in a particular embodiment. Moreover, any parameter or combination of parameter(s) including parameter(s) listed in the above instances and/or parameter(s) not listed in the above instances may be considered, depending on the embodiment.

Specification(s) may additionally or alternatively be set in stage 610 based on other factor(s) such as convenience.

In some embodiments, some of the techniques that will now be described in stages 620 to 650 may be similar to techniques used in fabricating other layer(s) of the device, such as the active layer(s), but adapted for fabrication of the defense layer, e.g. in accordance with the specifications of stage 610.

In stage 620, material characterized by a first of the at least two lattice constants that will characterize the defense layer may be provided.

In some embodiments, the material that may be provided may be material included in a layer (e.g. bulk or any other layer) formed prior to the fabrication of the defense layer, and fabrication of the defense layer may include transforming the previously formed layer or a sublayer of the previously formed other layer into a defense layer, e.g. by performing stages 630, 640 and/or 650 described below. In such embodiments, the previously formed layer may or may not have been part of first support.

In some other embodiments, the material that may be provided may be material that may be deposited (e.g. by epitaxy) at stage 620 on a previously formed layer. The material that may be deposited may or may not be characterized by the same lattice constant as a material in the previously formed layer upon which the material is deposited. The technique is not bound by the example of epitaxy and any suitable technique may be used for depositing the material.

In some cases, transforming a sub-layer of a previously formed layer, or depositing on a previously formed layer a material that is characterized by the same lattice constant as a material in the previously formed layer, may minimize or eliminate the enhancement or diminishment of the destabilizing force that may have otherwise occurred if there were different lattice constants for the previously formed layer and the provided material.

Implementation of stage 620 may in some instances be at least partly based on one or more specification(s) of stage 610. The specification(s) which may be used may vary depending on the example, but for the sake of further illustration to the reader, some examples are now provided. For example, the specifications of stage 610 may specify which material to use (e.g. based on value(s) for amount and/or direction of mismatch between lattice constants); which previously formed layer to use (e.g. based on value(s) for distance of defense layer from top, bottom and/or active layer(s)); dimensions of material that is provided (e.g. based on value(s) of dimensions of the defense layer); and/or amount of material that is provided (e.g. based on value(s) of amount of adjacent material with mismatched lattice constants), etc.

In some examples, the provided material may have the same lattice constant as the primary material included in the active layer(s) (e.g. a semiconductor material such as silicon) and as a material included the bulk layer(s), but in other examples, the provided material may not necessarily have the same lattice constant as the primary material included in the active layer(s) and/or may not have the same lattice constant as a material used in the bulk layer(s).

Additionally or alternatively, in some examples, the provided material may be a semiconductor material but in other examples, the provided material may be any appropriate material and not necessarily a semiconductor material.

Stages 630, 640, and 650 may be performed as many time(s) as there are other lattice constant(s) (besides the first lattice constant) that characterize the defense layer. For example, if the defense layer is characterized by two lattice constants, then the stages may be performed once. If the defense layer is characterized by three lattice constants, then the stages may be performed twice, each time for a different one of the other lattice constants, etc.

Continuing with the example, assume J represents the quantity of other lattice constants (other than the first lattice constant). Stage 625 in FIG. 6 shows j=1 for the initial iteration, for the initial other lattice constant (other than the first lattice constant). Stages 630, 640, and 650 may be performed. If j is not yet equal to J (stage 655), then j becomes j+1 (stage 660), and a next of the other lattice constant(s) may be used in the next iteration of stages 630, 640, and 650. Otherwise, if j=J, iteration of stages 630, 640, and 650 may end.

For simplicity's sake, stages 630, 640 and 650 will be described below with respect to a lattice constant termed "second lattice constant", that may be representative, depending on the value of j, of any other lattice constant (other than the first lattice constant) characterizing the defense layer.

In stage 630, at least one side (e.g. top and/or bottom) of the material provided in stage 620 may be patterned.

For example, patterning may include applying a photoresist on the at least one side of the material, covering the at least one side with a mask which defines a pattern for the second lattice constant (or in other words a pattern for depositing the material characterized by the second lattice constant), and exposing the at least one side to light through the mask. The photoresist may thereby be removed in accordance with the pattern.

In some embodiments, the mask may be designed at least partly based on one or more specification(s) of stage 610. Which specification(s) may be used may vary depending on the example, but for the sake of further illustration to the reader, some examples are now provided. For example, the mask may be designed based on specification(s) that may be have been set based on value(s) for any of the following parameter(s): amount of adjacent material with mismatched lattice constants; location of adjacent material with mismatched lattice constants in the defense layer (e.g. in relation to location of electrical element(s) and/or potential thinning); and/or distribution of adjacent material with mismatched lattice constants in the defense layer (e.g. in relation to distribution of electrical element(s) and/or location of potential thinning), etc.

The subject matter is not bound by the patterning technique described above and any suitable technique for patterning may be used. The pattern that may be used may vary depending on the instance, but for the sake of further illustration to the reader, some instances are now provided.

For instance, the pattern may include a grid, of any appropriate size spacing. Larger spacing may mean that more of the material characterized by the first lattice constant may remain in the defense layer after stage 640, whereas smaller spacing may mean that less of the material characterized by the first lattice constant may remain in the defense layer after stage 640.

In another instance, the pattern may additionally or alternatively include one or more horizontal lines (along the top and/or bottom of the material), of any appropriate width or varying widths. Less lines and/or narrower lines may mean that more of the material characterized by the first lattice constant may remain in the defense layer after stage 640, whereas more and/or wider lines may mean that less of the material characterized by the first lattice constant may remain in the defense layer after stage 640.

In another instance, the pattern may additionally or alternatively include one or more vertical lines (along the top and/or bottom of the material) of any appropriate width or varying widths. Less lines and/or narrower lines may mean that more of the material characterized by the first lattice constant may remain in the defense layer after stage 640, whereas more and/or wider lines may mean that less of the material characterized by the first lattice constant may remain in the defense layer after stage 640.

In another instance, the pattern may additionally or alternatively include a certain area of the defense layer (e.g. half of the defense layer; one or more circles or other shapes in the defense layer; etc.). A smaller area may mean that that more of the material characterized by the first lattice constant may remain in the defense layer after stage 640, whereas a larger area may mean that less of the material characterized by the first lattice constant may remain in the defense layer after stage 640.

In some embodiments, stage 630 may be omitted, for instance if material may be removed in stage 640 without patterning having been done beforehand.

In stage 640, a portion of the material provided in stage 620 may be removed, e.g. in accordance with the pattern.

For example, the portion of material may be removed by applying a solvent that etches the material in accordance with the pattern but does not etch the material where covered by the photoresist. However, the subject matter is not bound by such a technique and any suitable technique to remove the portion may be used.

Implementation of stage 640 may in some instances be at least partly based on one or more specification(s) of stage 610 as will now be described. The specification(s) may vary depending on the example, but for the sake of further illustration to the reader some examples are now provided. For example, specification(s) may have been set based on amount of adjacent material with lattice constant mismatch, vis-à-vis the layer(s) above and/or below the defense layer, e.g. the layer directly above, if any, and/or the layer immediately below, if any. Continuing with the example, the removal of a portion of the material may vary depending on whether or not it is desirable that the material(s) that will be subsequently deposited in stage 650 be adjacent to the layer(s) above and/or below the defense layer. In some cases, it may be desirable that no deposited material be adjacent to the layer(s) above and/or below e.g. to avoid or to minimize any effect (e.g. enhancement or diminishment) on the destabilizing force due to a mismatch in lattice constants between the deposited material(s) and the material(s) in the layer(s) above and/or below. In such cases, the etching may remove a portion of the provided material inside the layer, but may not remove provided material near the top of the defense layer and/or near the bottom of the defense layer, so that presumably only provided material may be adjacent to the layer above and/or below the defense layer.

Optionally, the photoresist may be removed after stage 640, since the photoresist may no longer be required.

In stage 650, material characterized by the second lattice constant may be deposited (e.g. by epitaxy) in accordance with the pattern and in place of the removed portion of the material provided in stage 620. The material that is deposited, for instance, may all be the same material with the same crystallographic orientation, or, for instance, may not all be the same material/orientation but may share the second lattice constant. The technique is not bound by the example of epitaxy and any suitable technique may be used for depositing the material.

For example, material that may be deposited may be the same material as the material provided in stage 620 but with a different crystallographic orientation than the material provided in stage 620 and/or may be a different material than the material provided in stage 620.

Implementation of stage 650 may in some instances be at least partly based on one or more specification(s) of stage 610. Which specification(s) may be used may vary depending on the example, but for the sake of further illustration to the reader, some examples are now provided. For example, the specification(s) of stage 610 may specify which material to use in stage 650 (e.g. based on value(s) for amount and/or direction of mismatch between lattice constants).

In some cases, the material deposited in stage 650 may include a material having the same lattice constant as the primary material (e.g. a semiconductor material such as silicon) included in the active layer(s) and included in the bulk layer(s), as long as the material provided in stage 620 is not characterized by the same lattice constant. However, in other cases, the deposited material may not include a material having the same lattice constant as the primary material included in the active layer(s) and/or having the same lattice constant as a material used in the bulk layer(s).

Additionally or alternatively in some cases, the deposited material may be a semiconductor material but in other cases, the deposited material may be any appropriate material and not necessarily a semiconductor material.

In examples where stages 630, 640 and 650 are performed more than once (e.g. J is larger than 1), because the defense layer is characterized by three or more lattice constants, the determination of where material(s) characterized by the various other lattice constants should be deposited in relation to the material characterized by the first lattice constant may be based on one or more of the specification(s) of stage 610. Continuing with the example, specification(s) of stage 610 may be set based on value(s) of location and/or distribution of adjacent material with a certain amount and/or direction of mismatch, versus value(s) of location and/or distribution of adjacent material with a different amount and/or direction of mismatch. Additionally or alternatively, specification(s) of stage 610 may have been set based on convenience, e.g. of fabrication. It may be more convenient if J is larger than 1, for instance, that if there is a plurality of distributed horizontal and vertical etchings, all horizontal etchings be filled by a material characterized by the same lattice constant, and all vertical etchings be filled by a material characterized by a lattice constant that is different than the lattice constant of the material filling the horizontal etchings. For another instance, it may be more convenient if J is larger than 1 that all etchings that are near one another be filled by a material characterized by the same lattice constant, etc.

In some embodiments, stage(s) shown in FIG. 6 may be performed in a different order than illustrated, and/or two or more stages that are shown as being sequentially performed may be performed simultaneously. Additionally or alternatively, in some embodiments, fabrication of defense layer(s) may include fewer, more and/or different stages than illustrated in FIG. 6.

Referring again to FIG. 2A, defense layer 222 may, for example, be fabricated on top of bulk layer 226, and then bulk layer 224 may be fabricated on top of defense layer 222. Additionally or alternatively, defense layer 222 may, for example, be fabricated on the bottom of bulk layer 224, and then bulk layer 226 may be fabricated on the bottom of defense layer 222. First support 224 and/or 226 may cause defense layer 222 to remain intact during fabrication of the defense layer. For example, defense layer 222 may be fabricated by removing some of the silicon in accordance with a pattern of lines 228, and replacing the removed silicon with silicon having a different crystallographic orientation or with a different material. Lines 228 represent the material deposited in place of the removed silicon.

Refer now to FIG. 3B, which illustrates another example of a defense layer, in accordance with some embodiments of the presently disclosed subject matter. In FIG. 3B a cross section of wafer segment 310 including dies 312 and 314 is shown. As shown in FIG. 3B, defense layer 322 may be fabricated on top of a bulk layer 320 by removing some of the silicon in accordance with a pattern of lines 324, and replacing the removed silicon with silicon of a different crystallographic orientation or with a different material. Lines 324 represent the material deposited in place of the removed silicon.

FIG. 4B illustrates another example of a defense layer, in accordance with some embodiments of the presently disclosed subject matter. In FIG. 4B, a cross section of wafer segment 410 including dies 412 and 414 is shown. As shown in FIG. 4B, defense layer 426 may be fabricated on the bottom of bulk layer 436 by removing some of the silicon in accordance with a pattern of lines 428, and replacing the removed silicon with silicon of a different crystallographic orientation or with a different material. Lines 428 represent the material deposited in place of the removed silicon.

Figure 5B:
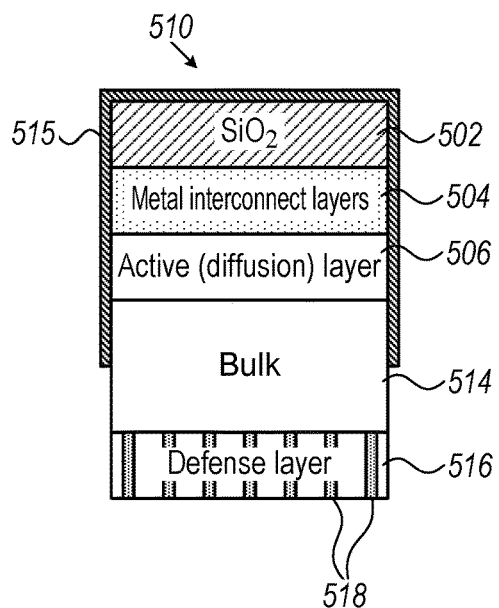
FIG. 5B illustrates another example of a defense layer, in accordance with some embodiments of the presently disclosed subject matter.

FIG. 5B illustrates another example of a defense layer, in accordance with some embodiments of the presently disclosed subject matter. In FIG. 5B, a cross section of die 510 is shown. As shown in FIG. 5B, defense layer 516 may be fabricated on the bottom of bulk layer 514 by removing some of the silicon in accordance with a pattern of lines 518, and replacing the removed silicon with silicon of a different crystallographic orientation or with a different material. Lines 518 represent the material deposited in place of the removed silicon.

Continuing with the description of method 100 of FIG. 1, in stage 130, second support may be provided after fabricating the defense layer(s), if required.

For example, the provision of second support may be required to restrain at least a sufficient part of the destabilizing force to keep the defense layer(s) intact, e.g. at least as long as there is no thinning attack.

The second support that may be provided may vary depending on the example, but for the sake of further illustration to the reader some examples are now provided.

FIG. 2B illustrates an example of second support, in accordance with some embodiments of the presently disclosed subject matter.

In FIG. 2B, cross sections of wafers 210 and 220 are shown. As shown in FIG. 2B, wafer 210 may be bonded on top of wafer 220. In some other embodiments, wafer 210 may instead be bonded on the bottom of wafer 220.

Wafer 210 therefore may be considered to be an example of second support. Additionally or alternatively, layer 224 or 226, if fabricated after defense layer 222, may be considered to be an example of second support.

The bonding of wafers 210 and 220 may include any suitable technique(s) for bonding wafers. For example, wafer 210 may include a layer of silicon dioxide on the bottom of or on the top of the layer of wafer 210 which will be bonded to wafer 220. Continuing with the example, if wafer 210 will be bonded on the bottom of wafer 220, then the layer of silicon dioxide may be placed directly on top of layer 216. If wafer 210 will be bonded on the top of wafer 220 then the layer of silicon dioxide may be placed directly on the bottom of layer 218. Wafers 210 and 220 may then be bonded together, for instance by anodic annealing.

Figure 3C:
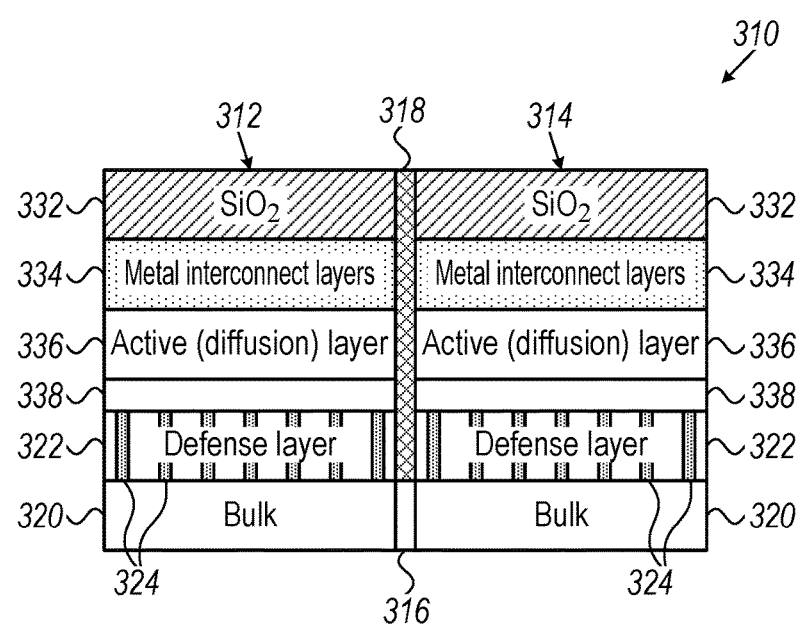
FIG. 3C illustrates another example of second support, in accordance with some embodiments of the presently disclosed subject matter.

FIG. 3C illustrates another example of second support, in accordance with some embodiments of the presently disclosed subject matter.

In FIG. 3C a cross section of wafer segment 310 including dies 312 and 314 is shown. As shown in FIG. 3C, one or more layers may be fabricated above defense layer 322. The one or more layer(s) that may be fabricated above defense layer 322 may be an example of second support. The one or more layers may include protection layer(s) 332, metal interconnect layer(s) 334, active diffusion layer(s) 336 and/or bulk layer(s) 338.

Refer again to FIG. 4B, which may be illustrative of an example where the provision of second support may be optional.

Depending on whether not the thickness of layers 430, 432, 434, and 436 may be sufficient after hard material 418 is removed to keep defense layer 426 intact (at least as long as there is no thinning attack), it may or may not be necessary to fabricate a bulk layer 440 below defense layer 426. Bulk layer 440 may be an example of second support. Even if a bulk layer below defense layer 426 is unnecessary to keep defense layer 426 intact, it may be possible that bulk layer 440 may still be fabricated, for instance, so that defense layer 426 may not be the bottommost layer of the semiconductor device.

Although the possibility of second support being optional was discussed with reference to FIG. 4B, in some embodiments whether or not second support is required may be decided during the design of the semiconductor device regardless of the particular first support that may be provided, e.g. such as shown in any of FIGS. 2 to 5. For example, the decision may be at least partly based on a target value for a thickness parameter, versus how much of the first support (if any) may remain after fabrication of the device, and thus contribute to the thickness. Continuing with the example, if any remaining first support may not contribute to the thickness enough to meet the target value, then second support may be required. In some other embodiments, second support may always be assumed to be required and thus provided during fabrication of the semiconductor device, or may be assumed to never be required and therefore never provided during fabrication of the semiconductor device.

Figure 5C:
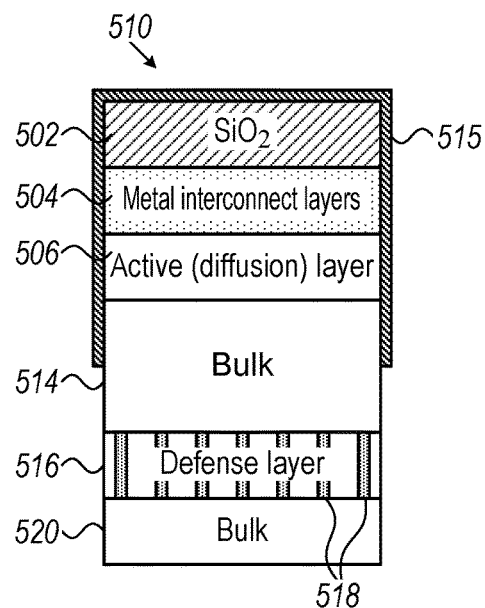
FIG. 5C illustrates another example of second support, in accordance with some embodiments of the presently disclosed subject matter.

FIG. 5C illustrates another example of second support, in accordance with some embodiments of the presently disclosed subject matter.

In FIG. 5C, a cross section of die 510 is shown. As shown in FIG. 5C, bulk 520 may be deposited below defense layer 516. Bulk 520 may be an example of second support.

Continuing with method 100 of FIG. 1, in stage 140, at least part of the first support may optionally be removed, after fabrication of the defense layer(s).

For example, if second support was provided in stage 130, then removal of the at least part of the first support may occur after provision of the second support.

The optional removal of at least part of the first support may be in addition to or instead of any optional transformation of part of first support into defense layer(s) (see above discussion of stage 620).

FIG. 2C illustrates an example of removal of a part of the first support, in accordance with some embodiments of the presently disclosed subject matter.

In FIG. 2C, cross sections of wafers 210 and 220 are shown. In FIG. 2C, bulk layer 226 is assumed to be an example of first support. A part of bulk layer 226 may be excess material that may no longer be necessary to keep defense layer 222 intact, and may be removed, e.g. by thinning the bottom of bulk layer 226. For example, after wafers 220 and 210 have been bonded, the previously introduced stiffening force may be assumed to be at least partly dependent on the thickness of second support (e.g. thickness of at least one of layer(s) of wafer 210 and/or layer 224) and/or on the thickness of first support (e.g. bulk layer 226). The stiffening force may be more than enough to cause a sufficient destabilizing force to be restrained to keep defense layer 222 intact. Therefore, a part of bulk layer 226 (the excess material) may not be required to keep defense layer 122 intact and may be removed, and still it may be assumed that the lessened stiffening force may cause at least a sufficient part of the destabilizing force to be restrained to keep defense layer 222 intact (e.g. as long as there is no thinning attack which for instance further thins bulk layer 226). However, in some other embodiments, no material may be removed from bulk layer 226. For instance, material may not be removed because the (current) thickness of bulk layer 226 may be required to keep defense layer 222 intact, and/or for instance because not removing material as long as the dimensions of the semiconductor device are acceptable may save on resources in fabricating the semiconductor device.

Referring again to FIG. 3C, material 318 may be removed when the wafer is diced. Dicing may separate dies 312 and 314 from each other and from any other dies (not shown) on the wafer.

Referring again to FIG. 4B, material 418 may be removed when the wafer is diced. Dicing may separate dies 412 and 414 from each other and from any other dies (not shown) on the wafer.

Referring again to FIG. 5C, external gripper 515 may be removed after bulk layer 520 has been deposited.

In any of FIGS. 3C, 4B, and/or 5C, a part of the first support may or may not remain after fabrication of the device, depending on the embodiment. For instance, depending on the embodiment, any layer formed before fabrication of defense layer 324, 426, or 516 and that may considered to be first support, may or may not remain, fully or in part, after fabrication of defense layer 324, 426, or 516 and any provision of second support.

After completion of fabrication of a semiconductor device, e.g. in accordance with method 100, at least a sufficient part of the destabilizing force may be restrained for the defense layer(s) to remain intact unless reduction in thickness of at least a section of at least one of: provided second support, if any, or remaining of the first support, if any, causes at least some of the destabilizing force that was restrained to no longer be restrained, and consequently at least part of at least one of the one or more defense layers to break.

For example, assuming no thinning attack has taken place, the previously introduced stiffening force may be assumed to be at least partly dependent on thickness of any provided second support and/or any first support remaining after fabrication of the semiconductor device. In some cases, the stiffening force may, in addition, be assumed to be at least partly dependent on the thickness of the defense layer(s), but typically although not necessarily the contribution of the thickness of the defense layer(s) to the stiffening force may be smaller than the contribution of the thickness of any provided second support and/or any remaining first support to the stiffening force, and the thickness of the defense layer(s) may possibly contribute to a destabilizing force. Therefore any contribution of the thickness of the defense layer(s) to the stiffening force may be ignored, for simplicity's sake. The stiffening force may counter the destabilizing force, as discussed above. Provided second support, if any, and/or first support remaining after fabrication of the semiconductor device, if any, may include one or more layers above and/or below the defense layer. For example, other than the defense layer(s), the semiconductor device may include a plurality of other layers. The one or more layers that may be included in provided second and/or remaining first support, may be layer(s) included in the plurality of other layers.

In some embodiments, stage(s) shown in FIG. 1 may be performed in a different order than illustrated, and/or two or more stages that are shown as being sequentially performed may be performed simultaneously. Additionally or alternatively, in some embodiments, method 100 may include fewer, more and/or different stages than illustrated in FIG. 1.

As mentioned above it may be possible to have a defense layer that is also an active layer. For an active layer that is also a defense layer, it may be desirable that the specification(s) substantially ensure that the electrical characteristics of electrical elements in the active layer are not adversely affected, at least as long as there is no thinning attack. For example, specification(s) may be set in stage 610 that are at least partly based on value(s) of location and/or distribution of electrical elements in the active layer relative to location and/or distribution of adjacent material with mismatched lattice constants in the active layer, may substantially ensure that the electrical characteristics of electrical elements in the active layer are not adversely affected, at least as long as there is no thinning attack. It is noted that in an active layer that is also a defense layer there may be section(s) characterized by mismatched lattice constants in accordance with defense layer features. Such section(s) may take up space in the active layer that may otherwise be used for electrical elements, or may necessitate a larger active layer. Therefore, a defense layer that is not also an active layer may be advantageous in some cases, to avoid such electrical and/or space considerations associated with a defense layer that is an active layer. On the other hand, an advantage of a defense layer that is also an active layer may include increasing the probability of a break in the active layer, which probability may already be high even if the defense layer is separate.

Although method 100 was described with reference to one or more defense layer(s), each defense layer characterized by at least two lattice constants, in some embodiments there may additionally or alternatively be one or more defense pair(s) of layers. For example, a layer of a defense pair characterized by a certain lattice constant may be deposited on top of another layer of the defense pair characterized by another lattice constant. The stages of fabricating a semiconductor device with at least one defense pair of layers may be similar to stages 110 to 140 described above. Fabrication of a defense pair may include stages similar to stages of method 600 described above, but relating to a defense pair rather than to a defense layer. Depending on the requirements for fabricating a defense pair, the parameter(s) that may be considered when setting specification(s) relating to fabrication of the defense pair may include more, fewer, and/or different parameter(s) than described above for a defense layer with reference to stage 610. For example, the adjacent material with mismatched lattice constants may be material in different layers of the defense pair. Continuing with the example, if one layer in a defense pair includes a small amount of material with a given lattice constant directly above or directly below the second layer in the defense pair that includes a material of another lattice constant, the resulting destabilizing force may possibly be smaller than if the one layer instead included more of the material with the given lattice constant. Still continuing with the example, if one of the layers in the defense pair does not extend fully on top of or on the bottom of the other layer in the defense pair, the destabilizing force may possibly be smaller than if fully extended. For another example, the location and/or distribution of adjacent material may be dependent on the dimension(s) of the various layers in the pair in relation to one another, e.g. whether fully extended on one another or not.

For another example, if adapting stages 620 to 650 for a defense pair, one of the layers in a defense pair may already be formed (e.g. part of first support) and may be provided as a layer in the defense pair, or a sub-layer of the previously formed layer may be provided as a layer in the defense pair. Alternatively, in the example, the two layers in the defense pair may be deposited on the top of or on the bottom of an already formed layer. In some cases of fabrication of a defense pair of layers, the lattice constant of the upper layer in the pair may be matched to (i.e. may be the same as) the lattice constant of the layer directly above the upper layer, and/or the lattice constant of the lower layer in the pair may be matched to the lattice constant of the layer directly below the lower layer, but in other cases such matching may not be necessary. Additionally or alternatively in some cases of fabrication of a defense pair of layers, no patterning nor removal of material may be required, as material with a certain lattice constant may be deposited as a layer of the pair directly above or directly below a layer of the pair characterized by another lattice constant.

After fabrication of a semiconductor device, e.g. in accordance with method 100, at least a sufficient part of the destabilizing force may be restrained for the defense layer(s) and/or defense pair(s) of layers to remain intact, at least as long as there is no thinning attack on the semiconductor device.

Assume that during a thinning attack, there may be a reduction in thickness of at least a section of one or more layer(s) of the semiconductor device. Additionally or alternatively, there may be a reduction in thickness of at least a section of at least one of: provided second support, if any, or remaining of the first support, if any. The reduction in thickness may cause at least some of the destabilizing force that was restrained to no longer be restrained and consequently at least part of at least one of the one or more defense layers (or at least part of at least one layer in at least one of the one or more defense pairs) may break. Optionally, at least a portion of at least one other layer (e.g. that is not a defense layer or a layer in a defense pair) may break. For example, at least a portion of one or more layers above and/or below each defense layer (and/or above and/or below each pair of defense layers) may break, perhaps including at least a portion of at least one active layer. Possibly all of the layers of the semiconductor device may break.

Figure 7A:
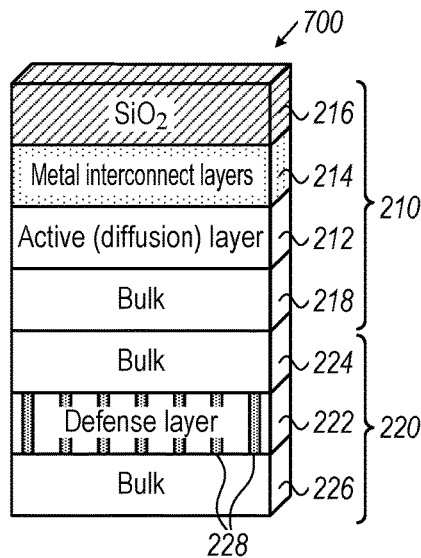
FIGS. 7A, 7B, 7C and 7D illustrate a semiconductor device being attacked, in accordance with some embodiments of the presently disclosed subject matter.
Figure 7B:
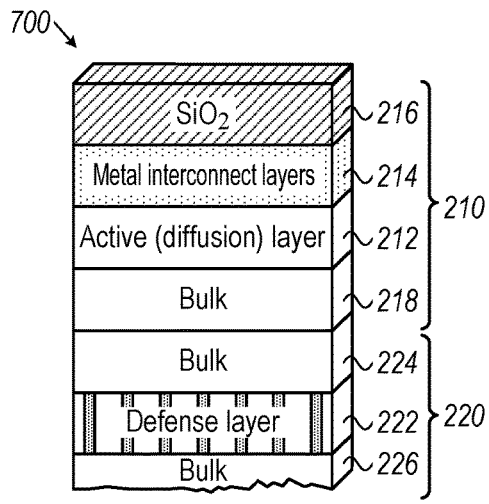
Figure 7C:
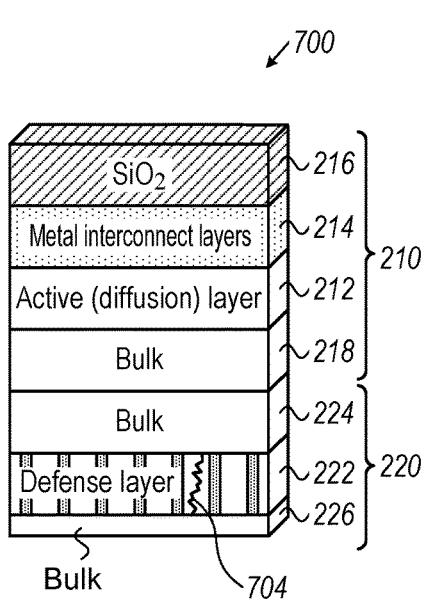
Figure 7D:
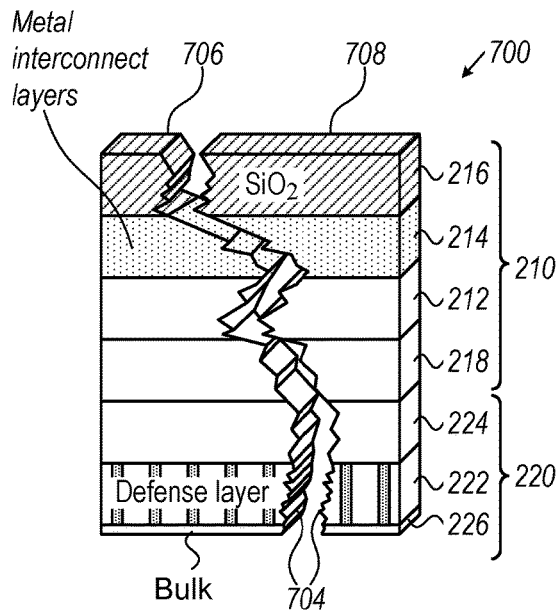

Refer to FIGS. 7A, 7B, 7C and 7D which illustrate a semiconductor device 700 under attack, in accordance with some embodiments of the presently disclosed subject matter. For the sake of example, FIG. 7A resembles FIG. 2C. FIG. 7B illustrates bulk layer 226 being thinned during an attack. FIG. 7C illustrates a continuation of the thinning of bulk layer 226, and defense layer 222 breaking (in the illustration cracking). Crack line 704 is therefore shown in FIG. 7C. FIG. 7D illustrates a complete separation where the entire semiconductor device 700 breaks into two components 706 and 708. The complete separation into components may occur in addition to or instead of the cracking. For instance FIG. 7D illustrates that when thinning of bulk layer 226 continues, semiconductor device 700 separates into two components 706 and 708 including along crack line 704. It should be understood that FIGS. 7A to 7D are for the purpose of illustration only, and that in other embodiments, the semiconductor device may look different, and the breaking may be different than illustrated.

In the above description of example embodiments, numerous specific details were set forth in order to provide a thorough understanding of the subject matter. However, it will be understood by those skilled in the art that some examples of the subject matter may be practiced without such specific details. In other instances, well-known features have not been described in detail so as not to obscure the subject matter.

Usage of the terms "normally", "typically although not necessarily", "typically", "conventionally", "although not necessarily so", "such as", "e.g.", "possibly", "perhaps", "it may be possible", "optionally", "say", "one embodiment", "embodiments", "an embodiment", "some embodiments", "certain embodiments", "example embodiments", "various embodiments", "other embodiments", "some other embodiments", "another embodiment", "for example" "one example", "an example" "some examples", "examples", "another example", "various examples", "other examples", "for instance", "an instance", "one instance", "some instances", "another instance", "other instances", "various instances" "one case", "cases", "some cases", "another case", "other cases", "various cases", or variants thereof should be construed as meaning that a particular described feature is included in at least one non-limiting embodiment of the subject matter, but not necessarily in all embodiments. The appearance of the same term does not necessarily refer to the same embodiment(s).

Usage of conditional language, such as "may", "can", "could", or variants thereof should be construed as conveying that one or more embodiments of the subject matter may include, while one or more other embodiments of the subject matter may not necessarily include, a particular described feature. Thus such conditional language is not generally intended to imply that a particular described feature is necessarily included in all embodiments of the subject matter. Non-usage of conditional language does not necessarily imply that a particular described feature is necessarily included in all embodiments of the subject matter.

It will be appreciated that various features of the disclosure which are, for clarity, described in the contexts of separate embodiments may also be provided in combination in a single embodiment. Conversely, various features of the disclosure which are, for brevity, described in the context of a single embodiment may also be provided separately or in any suitable sub-combination. It will be appreciated by persons skilled in the art that the present disclosure is not limited by what has been particularly shown and described hereinabove. Rather the scope of the disclosure is defined by the appended claims and equivalents thereof.

What is claimed is:

1. A method of fabricating a semiconductor device including a plurality of layers, comprising the steps of:
   providing a first support prior to fabricating one or more of the plurality of layers as one or more defense layers;
   fabricating the one or more defense layers, the one or more defense layers each characterized by at least two lattice constants that are mismatched, wherein a mismatch in the lattice constants causes a destabilizing force that comprises at least one of a tensile force or a compressive force, and wherein the one or more defense layers remain intact while being fabricated at least partly due to the first support; and
   after fabricating the one or more defense layers, at least a sufficient part of the destabilizing force is restrained for the one or more defense layers to remain intact, unless a reduction in thickness of at least a section of at least one of a provided second support or remaining of the first support, if any, causes at least some of the destabilizing force that was restrained to no longer be restrained, and consequently at least part of at least one of the one or more defense layers to break.

2. The method of claim 1, wherein for each of the one or more defense layers, fabricating the defense layer includes setting one or more specifications at least partly based on at least one value for at least one parameter selected from a group comprising:
   amount of mismatch between the lattice constants;
   direction of mismatch between the lattice constants;
   amount of adjacent material with the mismatched lattice constants;
   location in the defense layer of adjacent material with mismatched lattice constants;
   distribution in the defense layer of the adjacent material with the mismatched lattice constants;
   dimensions of the defense layer;
   thickness of any provided second support or any of the first support that will remain;
   which material(s) to include in any provided second support or any of the first support that will remain;
   distance of the defense layer from at least one of a top or bottom of the device;
   distance of the defense layer from one or more active layers in the device;
   distribution of electrical elements relative to the distribution of adjacent material with the mismatched lattice constants;
   location of electrical elements relative to the location of adjacent material with the mismatched lattice constants;
   and visibility of the defense layer.

3. The method of claim 1, wherein for each of the one or more defense layers said fabricating includes:
   providing a provided material characterized by a first one of the at least two lattice constants; and
   performing one or more times the following:
      patterning at least one side of the provided material;
      removing a portion of the provided material in accordance with the pattern; and
      depositing in accordance with the pattern and in place of the removed portion of the provided material, material characterized by a different one of the at least two lattice constants, the deposited material being at least one of a same material with a different crystallographic direction as the provided material or a different material than the provided material.

4. The method of claim 1, further comprising at least one of:
   providing the provided second support after fabricating the one or more defense layers; or
   removing at least part of the first support after fabricating the one or more defense layers.

5. The method of claim 1, wherein the first support includes a hard material on at least one boundary between the semiconductor device and at least one other semiconductor device on a wafer.

6. The method of claim 1, wherein at least one of the first support or the provided second support, if any, includes at least one of the plurality of layers of the device.

7. The method of claim 1, wherein the first support includes an external gripper operative to grip at least part of an edge around the semiconductor device.

8. The method of claim 1, further comprising reducing the thickness of the at least section.

9. The method of claim 1, wherein none of the one or more defense layers is an active layer.

10. A semiconductor device, comprising:
    one or more defense layers, the one or more defense layers each characterized by at least two lattice constants that are mismatched, wherein a mismatch in the lattice constants causes a destabilizing force that comprises at least one of a tensile force or a compressive force; and
    a plurality of other layers, wherein at least a sufficient part of the destabilizing force is restrained for the one or more defense layers to remain intact, unless a reduction in thickness of at least a section of one or more of the plurality of other layers causes at least some of the destabilizing force that was restrained to no longer be restrained, and consequently at least part of at least one of the one or more defense layers to break.

11. The device of claim 10, wherein the plurality of other layers includes one or more bulk layers and one or more active layers, and wherein a semiconductor material having one of the at least two lattice constants is included in all of the one or more defense layers, is also included as a primary material in the one or more active layers, and is also included in the one or more bulk layers.

12. The device of claim 10, wherein for each of at least one of the one or more defense layers, fabrication of the defense layer included removing a portion of a material characterized by a first one of the at least two lattice constants, and depositing one or more materials characterized by one or more of the at least two lattice constants in place of the removed portion of the material.

13. The device of claim 10, wherein for each of at least one of the one or more defense layers, at least two of the lattice constants characterizing the defense layer characterize the defense layer because of a material inclusion having different crystallographic orientations in the defense layer.

14. The device of claim 10, wherein at least one of the plurality of other layers is characterized by at least one lattice constant that is different than one or more of the at least two lattice constants, causing said destabilizing force to be enhanced or diminished.

15. The device of claim 10, wherein for each of at least one of the one or more defense layers, at least two of the lattice constants characterizing the defense layer characterize the defense layer because of an inclusion of different materials in the defense layer.

16. The device of claim 10, wherein at least a portion of at least one of the plurality of other layers breaks if the at least some of the destabilizing force that was restrained becomes no longer restrained.

17. The device of claim 10, wherein the plurality of other layers includes two or more bulk layers, and wherein each of the one or more defense layers is embedded between two bulk layers.

18. The device of claim 10, wherein the plurality of other layers includes one or more active layers, each of the active layers comprising at least one semiconductor material, wherein the one or more defense layers are different layers than the one or more active layers.

19. The device of claim 18, wherein each of the one or more active layers is above or below each of the one or more defense layers, and wherein the plurality of other layers includes at least one additional layer between each of the one or more defense layers and at least one closest active layer from among the one or more active layers, the at least one closest active layer being at least one of above or below the defense layer.

20. A semiconductor device, comprising:
one or more defense pairs of layers, each of the one or more defense pairs including two layers that are not topmost or bottommost layers of the semiconductor device, that are not active, and that are characterized by lattice constants that are mismatched from each other, wherein a mismatch in the lattice constants causes a destabilizing force that comprises at least one of a tensile force or a compressive force; and
a plurality of other layers including one or more active layers, each comprising at least one semiconductor material,
wherein the one or more defense pairs of layers is below all of the one or more active layers, and if any layer in any of the one or more defense pairs is directly below any of the one or more active layers, the layer that is directly below the active layer is characterized by a same lattice constant as a primary material used in the active layer, and
wherein at least a sufficient part of the destabilizing force is restrained for the one or more defense pairs of layers to remain intact, unless a reduction in thickness of at least a section of one or more of the plurality of other layers causes at least some of the destabilizing force that was restrained to no longer be restrained, and consequently at least part of at least one of the one or more defense pairs to break.

\* \* \* \* \*